United States Patent
Khandros et al.

(10) Patent No.: US 6,690,185 B1
(45) Date of Patent: *Feb. 10, 2004

(54) LARGE CONTACTOR WITH MULTIPLE, ALIGNED CONTACTOR UNITS

(75) Inventors: Igor Y Khandros, Orinda; David V. Pedersen, Scotts Valley; Ralph G. Whitten, San Jose, all of CA (US)

(73) Assignee: FormFactor, Inc., Livermore, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/196,924

(22) Filed: Nov. 19, 1998

Related U.S. Application Data

(63) Continuation-in-part of application No. 08/994,799, filed on Dec. 19, 1997, which is a continuation of application No. 08/789,147, filed on Jan. 24, 1997, now Pat. No. 5,806,181, and a continuation-in-part of application No. 08/784,862, filed on Jan. 15, 1997, now Pat. No. 6,064,213.

(51) Int. Cl.$^7$ .............................................. G01R 31/02
(52) U.S. Cl. ................... 324/758; 228/180.22; 361/760
(58) Field of Search ...................... 439/66, 81; 324/754, 324/758, 761, 762; 361/760; 228/180.21, 180.22

(56) References Cited

U.S. PATENT DOCUMENTS

| | | | |
|---|---|---|---|
| 3,379,937 A | | 4/1968 | Sheperd |
| 3,702,982 A | * | 11/1972 | Kelly et al. .................. 439/422 |
| 3,781,683 A | | 12/1973 | Freed |
| 3,849,728 A | | 11/1974 | Evans |
| 3,963,986 A | | 6/1976 | Morton et al. |
| 4,032,058 A | | 6/1977 | Riseman |

(List continued on next page.)

FOREIGN PATENT DOCUMENTS

| DE | 4237591 | 11/1995 |
|---|---|---|
| DE | 19610123 | 10/1997 |

(List continued on next page.)

OTHER PUBLICATIONS

IBM Technical Disclosure Bulletin, Humenik, vol. 22, No. 6, p. 2286, Nov. 1979.*

(List continued on next page.)

*Primary Examiner*—Neil Abrams
(74) *Attorney, Agent, or Firm*—Stuart L. Merkadeau; N. Kenneth Burraston

(57) ABSTRACT

A method of fabricating a large contactor (62) is provided wherein one or more contactor units (78) are mounted on a support substrate (74) such that contact elements (80) attached to the contactor units are suitably aligned. In this manner, a large area contactor can be prepared using a plurality of smaller contactor units. Preferably the contact elements on the plurality of contactor units are coplanar across the contactor units. This is particularly advantageous for making a large contactor for probing semiconductor devices on a wafer. This also can be useful for making a contactor capable of contacting devices across an entire semiconductor wafer. In one embodiment, the contactor units self-align during reflow of a joining material such as solder balls (134) or other reflowable material interconnecting the contactor units and the support substrate. In alternative embodiments, alignment facilitation devices such as keys (154) and indentations (156) are utilized to assist the alignment of the contactor units.

8 Claims, 13 Drawing Sheets

U.S. PATENT DOCUMENTS

| | | | |
|---|---|---|---|
| 4,087,747 A | * | 5/1978 | Deegen et al. ............... 324/761 |
| 4,357,062 A | | 11/1982 | Everett |
| 4,508,405 A | | 4/1985 | Damon et al. |
| 4,522,893 A | | 6/1985 | Bohlen et al. |
| 4,528,500 A | | 7/1985 | Lightbody et al. |
| 4,553,192 A | | 11/1985 | Babuka et al. |
| 4,565,314 A | | 1/1986 | Scholz ................... 228/180.2 |
| 4,636,722 A | | 1/1987 | Ardezzone |
| 4,724,383 A | | 2/1988 | Hart |
| 4,740,410 A | | 4/1988 | Muller et al. |
| 4,811,081 A | * | 3/1989 | Lyden |
| 4,837,622 A | | 6/1989 | Whann et al. |
| 4,899,099 A | | 2/1990 | Mendenhall et al. |
| 4,899,106 A | | 2/1990 | Ogura |
| 4,918,032 A | | 4/1990 | Jain et al. |
| 4,953,834 A | | 9/1990 | Ebert et al. |
| 4,965,865 A | | 10/1990 | Trenary |
| 4,972,580 A | | 11/1990 | Nakamura ................... 29/840 |
| 4,983,907 A | | 1/1991 | Crowley |
| 4,998,885 A | | 3/1991 | Beaman |
| 5,172,050 A | | 12/1992 | Swapp |
| 5,175,491 A | * | 12/1992 | Ewers |
| 5,187,020 A | | 2/1993 | Kwon et al. |
| 5,191,708 A | | 3/1993 | Kasukabe et al. |
| 5,210,939 A | | 5/1993 | Mallik et al. |
| 5,225,777 A | | 7/1993 | Bross et al. |
| 5,236,118 A | | 8/1993 | Bower et al. |
| 5,276,395 A | | 1/1994 | Malloy |
| 5,278,442 A | | 1/1994 | Prinz et al. |
| 5,311,405 A | * | 5/1994 | Tribbey et al. ............. 361/767 |
| 5,312,456 A | | 5/1994 | Reed et al. |
| 5,373,627 A | | 12/1994 | Grebe |
| 5,393,375 A | | 2/1995 | MacDonald et al. |
| 5,395,253 A | | 3/1995 | Crumly |
| 5,418,471 A | * | 5/1995 | Kardos ....................... 324/758 |
| 5,422,574 A | | 6/1995 | Kister |
| 5,440,231 A | | 8/1995 | Sugai |
| 5,473,510 A | | 12/1995 | Dozier, II ................... 361/719 |
| 5,476,211 A | | 12/1995 | Khandros |
| 5,476,818 A | * | 12/1995 | Yanof et al. ................ 438/107 |
| 5,477,160 A | | 12/1995 | Love |
| 5,495,667 A | | 3/1996 | Farnworth et al. |
| 5,534,784 A | * | 7/1996 | Lum et al. .................. 324/761 |
| 5,555,422 A | * | 9/1996 | Nakano ....................... 324/754 |
| 5,569,272 A | | 10/1996 | Reed et al. |
| 5,576,630 A | * | 11/1996 | Fujita ......................... 324/760 |
| 5,593,322 A | * | 1/1997 | Swarmy et al. ............. 439/660 |
| 5,601,740 A | | 2/1997 | Eldridge et al. |
| 5,657,207 A | | 8/1997 | Schreiber .................... 361/774 |
| 5,691,650 A | * | 11/1997 | Sugai ........................ 324/762 |
| 5,741,144 A | * | 4/1998 | Elco et al. .................. 439/101 |
| 5,772,451 A | | 6/1998 | Dozier, II et al. ............ 439/70 |
| 5,786,701 A | | 7/1998 | Pedder |
| 5,806,181 A | | 9/1998 | Khandros et al. |
| 5,821,763 A | * | 10/1998 | Beaman et al. ............. 324/754 |
| 5,829,128 A | | 11/1998 | Eldridge et al. |
| 5,832,601 A | | 11/1998 | Eldridge et al. |
| 5,864,946 A | | 2/1999 | Eldridge et al. |
| 5,914,614 A | * | 6/1999 | Beaman et al. ............. 324/762 |
| 5,917,707 A | | 6/1999 | Khandros et al. |
| 5,920,200 A | * | 7/1999 | Pendse et al. ............... 324/758 |
| 5,923,178 A | | 7/1999 | Higgins et al. |
| 5,974,662 A | | 11/1999 | Eldridge et al. |
| 5,994,152 A | | 11/1999 | Khandros et al. |
| 5,998,864 A | | 12/1999 | Khandros et al. |
| 6,008,543 A | | 12/1999 | Iwabuchi ..................... 257/778 |
| 6,029,344 A | | 2/2000 | Khandros et al. |
| 6,050,829 A | | 4/2000 | Eldridge et al. |
| 6,053,395 A | * | 4/2000 | Sasaki ................... 228/180.22 |
| 6,064,213 A | * | 5/2000 | Khandros et al. ........... 324/754 |
| 6,110,823 A | | 8/2000 | Eldridge et al. |
| 6,174,744 B1 | | 1/2001 | Watanabe et al. |
| 6,184,053 B1 | | 2/2001 | Eldridge et al. |
| 6,229,324 B1 | * | 5/2001 | Akram ....................... 324/758 |

FOREIGN PATENT DOCUMENTS

| | | |
|---|---|---|
| EP | 61615 | 10/1982 |
| EP | 369112 | 5/1990 |
| EP | 460822 | 12/1991 |
| JP | 54146581 | 11/1979 |
| JP | 63-268285 | 11/1988 |
| JP | 2144869 | 6/1990 |
| JP | 6265575 | 9/1994 |
| WO | WO 91/12706 | 8/1991 |
| WO | WO 96/15458 | 5/1996 |
| WO | WO 96/38858 | 12/1996 |
| WO | WO 97/43653 A1 | 11/1997 |
| WO | WO 97/43656 | 11/1997 |
| WO | WO 98/21597 | 5/1998 |

OTHER PUBLICATIONS

Research Disclosure, No. 333, Emsworth, GB, Density Probe Assembly, Jan. 1992.*

Burbank et al., "Automatic Test Equipment Translator Board", IBM Technical Disclosure Bulletin, vol. 21, No. 4, pp. 1404–1405, Sep. 1997.

Renz, U., "Multipoint Test Probe for Printed Cards", IBM Technical Disclosure Bulletin, vol. 17, No. 2, pp. 459–460, Jul. 1974.

Renz, U., "Test Probe Contact Grid Translator Board", IBM Technical Disclosure Bulletin, vol. 21, No. 8, pp. 3235–3236, Jan. 1979.

Soejima, "New Probe Microstructure for Full–Wafer Contact–Probe Cards", 1999 IEEE, 1999 Electronics Components and Technology Conference, 6 pages (1999).

* cited by examiner

LARGE CONTACTOR WITH MULTIPLE, ALIGNED CONTACTOR UNITS

CROSS-REFERENCES TO RELATED APPLICATIONS

The present application is a continuation-in-part of U.S. patent application Ser. No. 08/994,799, file Dec. 19, 1997, which is a continuation of application Ser. No. 08/789,147, file Jan. 24, 1997, issued as U.S. Pat. No. 5,806,181, on Sep. 15, 1998. The present application also is a continuation in part of U.S. application Ser. No. 08/784,862, file Jan. 15, 1997, issued as U.S. Pat. No. 6,064,213, each of which are hereby incorporated by reference.

FIELD OF THE INVENTION

The present invention relates generally to a method of fabricating a large area multielement contactor and, more particularly, to a method of mounting multiple contactor units on a support substrate with precise alignment.

BACKGROUND OF THE INVENTION

Modern integrated circuits include many thousands of transistor elements with many hundreds of bond pads disposed in close proximity to one another (e.g., 5 mils center-to-center). The layout of the bond pads need not be limited to single rows of bond pads disposed close to the peripheral edges of the die (see, e.g., U.S. Pat. No. 5,453,583). The proximity and number of pads is a challenge to the technology of probing devices.

Semiconductor devices are generally fabricated on a wafer of silicon, with many devices on a single wafer. Modern technology uses 8-inch (200-cm) wafers, and is moving to 12-inch (300-cm) wafers. Essentially every single device fabricated on a wafer needs to be tested by probing. Probing more than one device at a time is particularly advantageous.

Modern probing equipment can probe 32 or more semiconductor devices at the same time.

However, this is only a small fraction of the total number of die on a wafer. There has been great interest in developing a probing system that can contact more, preferably all die on a wafer at the same time.

Generally, previous attempts at implementing schemes for partial or full wafer-level testing have involved providing a single test substrate with a plurality of contact elements for contacting corresponding pads on the wafer being tested. This may require extremely complex interconnection substrates and may include as many as tens of thousands of such contact elements. As an example, an 8" wafer may contain 500 16 Mb DRAMs, each having 60 bond pads, for a total of 30,000 connections. In one representative embodiment, there are 30,000 connections between the wafer under test (WUT) and the test electronics. Moreover, the fine pitch requirements of modem semiconductor devices require extremely high tolerances to be maintained when bringing the test substrate together with the wafer being tested.

To effect reliable pressure connections between contact elements and, e.g., a semiconductor device, one must be concerned with several parameters including, but not limited to: alignment, probe force, overdrive, contact force, balanced contact force, scrub, contact resistance, and planarization. A general discussion of these parameters may be found in U.S. Pat. No. 4,837,622, entitled HIGH DENSITY PROBE CARD, incorporated by reference herein, which discloses a high density epoxy ring probe card including a unitary printed circuit board having a central opening adapted to receive a preformed epoxy ring array of probe elements.

A more sophisticated probe card uses resilient spring elements to make contact with a device on a wafer. Commonly assigned parent application Ser. No. 08/789,147, now U.S. Pat. No. 5,806,181, entitled "Contact Carriers for Populating Larger Substrates with Spring Contacts", issued Sep. 15, 1998, discloses such a probe card in connection with what in that patent is FIG. 5, which is reproduced in this disclosure as FIG. 1A.

FIG. 1A illustrates an embodiment of a probe card assembly 500 which includes as its major functional components a probe card 502, an interposer 504 and a space transformer 506, and which is suitable in use for making temporary interconnections to a semiconductor wafer 508. In this exploded, cross-sectional view, certain elements of certain components are shown exaggerated, for illustrative clarity. However, the vertical (as shown) alignment of the various components is properly indicated by the dashed lines in the figure. It should be noted that the interconnection elements (514, 516, 524) are shown in full, rather than in section.

The probe card 502 is generally a conventional circuit board substrate having a plurality (two of many shown) of contact areas (terminals) 510 disposed on the top (as viewed) surface thereof. Additional components (not shown) may be mounted to the probe card, such as active and passive electronic components, connectors, and the like. The terminals 510 on the circuit board may typically be arranged at a 50-mil pitch. The probe card 502 is suitably round, having a diameter on the order of 12 inches.

The interposer 504 includes a substrate 512. Resilient interconnection elements 514 are mounted to and extend downward (as viewed) from the bottom (as viewed) surface of the substrate 512. Resilient interconnection elements 516 are mounted to and extend upward (as viewed) from the top (as viewed) surface of the substrate 512. Various spring shapes are suitable for the resilient interconnection elements 514 and 516. These elements preferably are composite interconnection elements with a soft core and hard shell. In another preferred embodiment, the resilient interconnection elements comprise a resilient material in a resilient shape. In one preferred embodiment, tips of interconnection elements 514 and 516 are at a pitch that matches that of the terminals 510 of the probe card 502.

The interconnection elements 514 and 516 are illustrated with exaggerated scale, for illustrative clarity. In certain preferred embodiments, the interconnection elements 514 and 516 extend to an overall height of 20–100 mils from respective surfaces of the interposer substrate 512.

The space transformer 506 includes a suitable circuitized substrate 518, such as a multilayer ceramic substrate having a plurality of terminals 520 disposed on the lower (as viewed) surface thereof and a plurality of terminals 522 disposed on the upper (as viewed) surface thereof. The terminals suitably may be contact areas or pads, or other structures known in the art. In this example, the lower plurality of contact pads 520 is disposed at the pitch of the tips of the interconnection elements 516 (e.g., 50 mils), and the upper plurality of contact pads 522 is disposed at a finer (closer) pitch (e.g., 25 mils). These resilient interconnection 514 and 516 elements are preferably, but not necessarily, composite interconnection elements.

A plurality of resilient interconnection elements 524 are mounted directly to the terminals 522 and extend upward (as viewed) from the top (as viewed) surface of the space transformer substrate 518. The resilient interconnection elements function as probes or probe elements. As illustrated, these resilient interconnection elements 524 are suitably arranged so that their tips (distal ends) are spaced at an even finer pitch (e.g., 5 mils) than their proximal ends, thereby augmenting the pitch reduction of the space transformer 506. These resilient contact structures (interconnection elements) 524 are preferably, but not necessarily, composite interconnection elements.

A problem associated with an array of contact elements, including spring contacts, is that often the terminals of an electronic component are not perfectly coplanar or are not aligned in an X-Y direction or in angular rotational direction with the contact pad. Contact elements lacking in some mechanism incorporated therewith for accommodating these "tolerances" (gross non-planarities) will be hard pressed to make consistent contact pressure contact with the contact pads of the electronic component.

Heretofore, it has been difficult and expensive to fabricate an assembly of contact elements of arbitrary size or shape to reliably make contact with the terminals of devices having a large size or an unusual shape.

SUMMARY OF THE INVENTION

Briefly stated, a method of manufacturing a contactor is provided wherein a plurality of contactor units is mounted on a support substrate such that contact elements attached to the contactor units align with a plurality of contact pads on a device. More particularly, a method of fabricating a segmented contactor according to the present invention comprises the steps of providing a support substrate, providing a contactor unit having a first plurality of electrical contact elements on a first surface thereof, providing and using an adjustment region to selectively position the contactor unit relative to the support substrate, and securing the contactor unit to the support substrate.

In the preferred embodiments, the contactor providing step includes providing a plurality of contactor units, the providing and using an adjustment region step includes selectively positioning the plurality of contactor units relative to the support substrate, and the securing step includes securing the plurality of contactor units to the support substrate.

Preferably, the electrical contact elements are coplanar across the plurality of contactor units. The contactor providing step can further include the steps of providing a second plurality of electrical contact elements on a second surface of the contactor unit and selectively positioning and securing the second electrical contact elements to the first electrical contact elements.

In one preferred embodiment, the securing step includes using a joining material that is malleable at an elevated temperature. The joining material is fixed into position at the elevated temperature. This allows the contactor units to self-align during reflow of the joining material interconnecting the contactor units and the support substrate. In alternative embodiments, alignment facilitation devices are utilized to assist the self-alignment of the contactor units during a malleable state of the joining material.

According to one particular implementation of the invention, probe elements such as spring contacts are prefabricated on individual spring contact carriers ("contactor units" or "tiles"). A number of these contactor units are mounted to a support substrate in a defined relationship with one another, preferably so that the tips of the spring contacts are coplanar with one another. The contactor unit substrates are preferably relatively inexpensive and conducive to successfully yielding spring contacts.

As used herein, the term "probe element" includes any element such as a composite interconnection element, spring contact, spring element, contact bump, or the like, suited to effect a pressure connection to terminals (e.g., bond pads) of an electronic component (e.g., a semiconductor die, including unsingulated semiconductor dies resident on a semiconductor wafer). A probe element also may be a terminal or receptacle to receive a resilient contact element to effect a pressure connection to terminals, e.g. springs, of an electronic component.

As used herein, the terms "contactor unit" or "tile" includes any component having probe elements on a surface thereof, a plurality (preferably identical) of which can be mounted to a larger substrate, thereby avoiding fabricating the probe elements directly upon the larger substrate.

As used herein, the term "contactor unit substrate" includes a solid substrate (e.g., see 100 in FIG. 4A) or the like.

As used herein, the term "a larger substrate" is any substrate having a surface on which a plurality of contactor units can be mounted. Generally, a number of contactor units would be mounted to the larger substrate, dictating that the surface area of the larger substrate would be much larger than the surface area of an individual contactor unit. This specifically includes the interconnect substrate of a probe card assembly.

According to a feature of the invention, a plurality of contactor units having spring contact elements fabricated on a surface thereof can be fabricated from a single, inexpensive substrate such as a ceramic wafer, which is subsequently diced to result in a plurality of separate, preferably identical contactor units which can be individually mounted to the surface of an interconnect substrate.

An advantage to the technique of using contactor units, rather than fabricating spring elements directly upon the surface of the electronic component is that the electronic component is readily reworked, simply by replacing selected ones of the one or more contactor units attached/connected thereto.

It is an object of the present invention to provide a contactor that overcomes the drawbacks of the prior art described above.

It is another object of the present invention to provide a method of fabricating a contactor that overcomes the drawbacks of the prior art described above.

It is a further object of the present invention to provide a method of mounting contactor units on a contactor such that the contactor units align with semiconductor devices resident on a product wafer.

These and other objects and advantages of the invention, as well as the details of an illustrative embodiment, will be more fully understood from the following specification and drawings.

BRIEF DESCRIPTION OF THE DRAWINGS

The aforementioned objects of the present invention as well as additional advantages thereof will be more clearly understood hereinafter as a result of a detailed description of a preferred embodiment of the invention when taken in conjunction with the following drawings in which:

FIGS. 5E–5H are side elevational views, partially in section, illustrating steps in a method of bringing the contactor units of the present invention into optimal alignment using a tip substrate.

DESCRIPTION OF THE PREFERRED EMBODIMENTS

The present invention centers on the concept of providing a segmented contactor made of a plurality of contact carriers (contactor units, tiles) aligned on a larger substrate. The contactor can be used in a number of applications, including in probe cards, a whole wafer contactor, an arbitrarily large or arbitrarily configured contactor. A large sized contactor could be assembled in the manner to be described hereinafter for long-term applications, such as socketing or permanent connections to a device. The tiles may be made of many materials, and are not limited to only having springs on them. In the following discussion, particular representative applications of the present invention are discussed, but the invention is not limited to these particular applications.

Figure 1A:
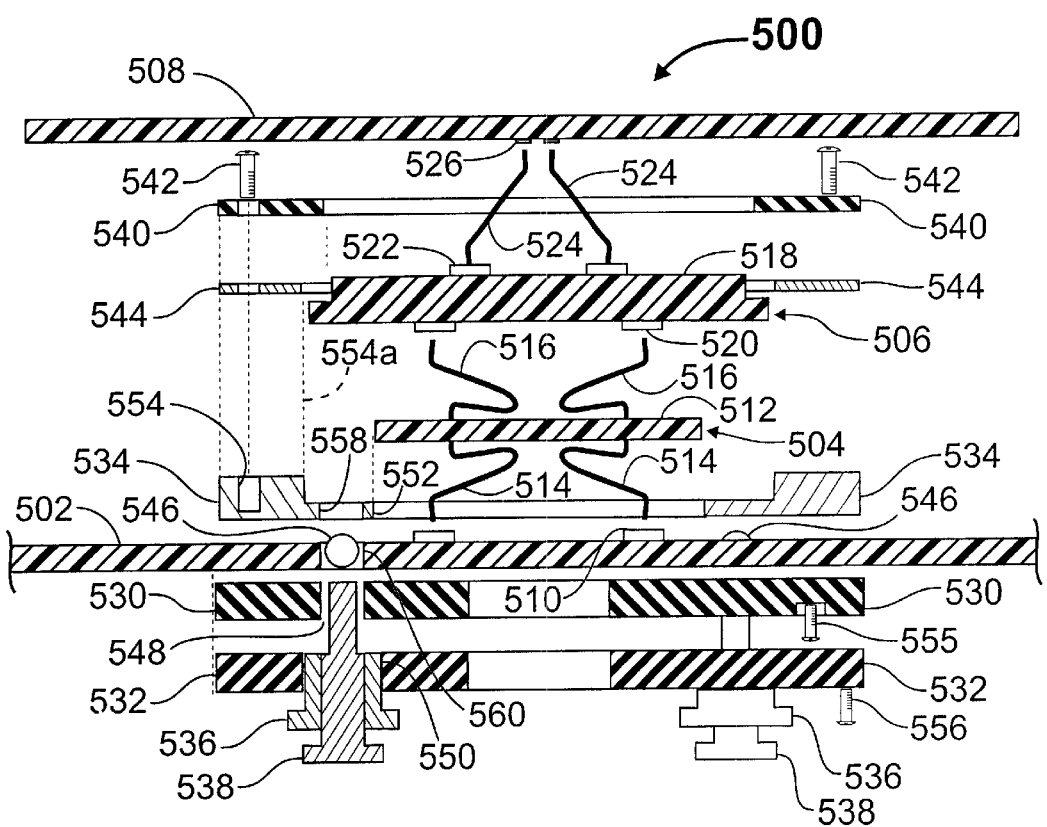
FIG. 1A is a diagrammatic view of a probe card assembly useful for probing die on a semiconductor wafer.
Figure 1B:
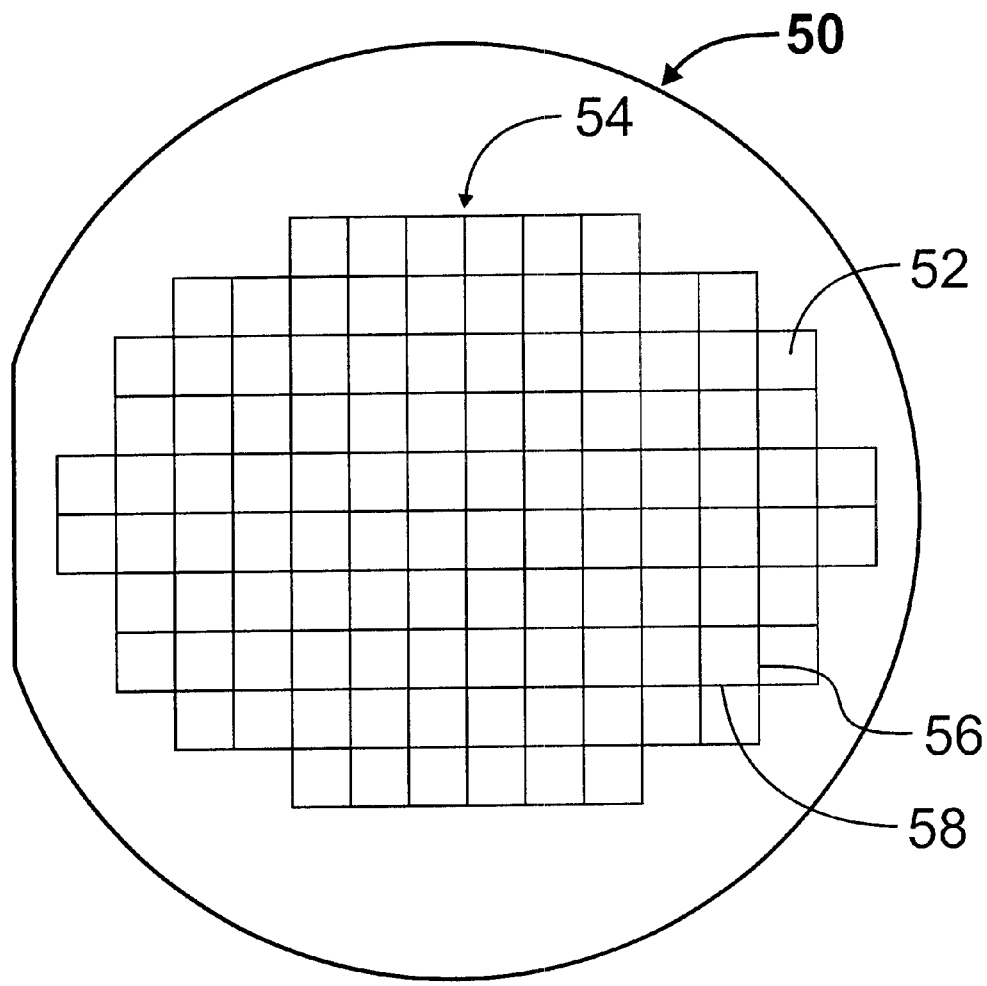
FIG. 1B is a diagrammatic top plan view of a semiconductor wafer.

The first discussed specific application of the concept of the invention is in a semiconductor testing device. Referring now to FIG. 1B, a semiconductor device (or die) layout on a semiconductor product wafer or wafer under test (WUT) 50 is illustrated. The WUT 50 has a plurality of semiconductor devices or devices under test (DUTs) 52 fabricated thereon. Typically, the DUTs 52 are positioned in an array 54 consisting of rows and columns. The rows and columns are separated by a plurality of dicing lanes 56 and 58. The dicing lanes 56 and 58 ultimately are scribed, cut, or sawed to separate each DUT 52 from the WUT 50 during a dicing and packaging step. The contactor 62 of the present invention can be used to test and to exercise a WUT.

Figure 2:
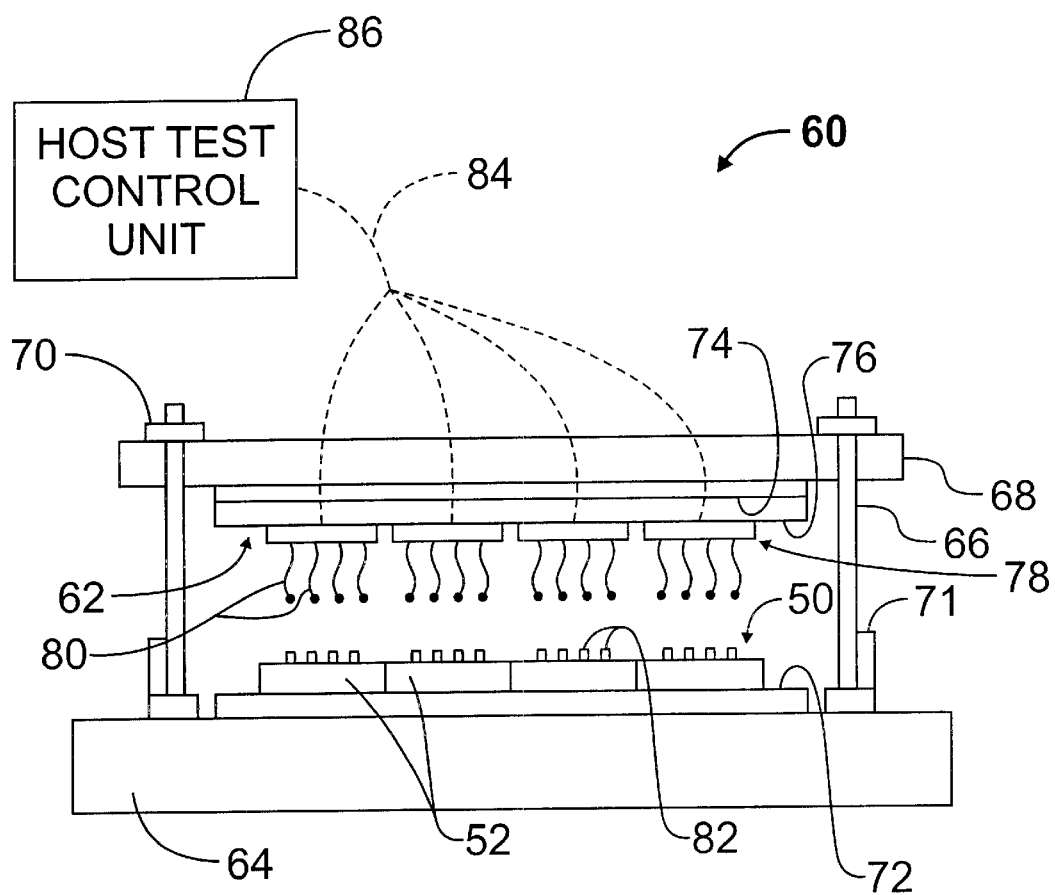
FIG. 2 is a cross-sectional view of a burn-in receptacle carrying a WUT and a contactor of the present invention.

Referring now to FIG. 2, a burn-in receptacle 60, loaded with a WUT 50 and an attached contactor 62, is shown. The receptacle 60 includes a base plate 64 having guide posts 66 securely attached thereto or integrally formed therewith. The guide posts 66 extend around the periphery of the base plate 64. An upper plate 68 is slidably mounted on guide posts 66. Fasteners 70 are rotatably mounted to the upper plate 68 and operably engaged with the guide posts 66 such that the upper plate 68 is moved towards and away from the base plate 64 by actuating the fasteners 70. A compression stop 71 (block ring) restricts the downward movement of the base plate 64 ensuring that the contactor 62 will engage the WUT 50 without damage due to over compression of the contactor 62 against the WUT 50.

Prior to loading, the WUT 50 is mounted on a carrier 72. One suitable mechanism for mounting uses an adhesive between an upper surface of the carrier 72 and a lower surface of the WUT 50. The carrier 72 facilitates handling of the WUT 50 during the fabrication and testing process. The carrier 72 may also be used to support the WUT 50 during the dicing process described above. The carrier 72 and WUT 50 are loaded into the receptacle 60 by mounting the carrier 72 to an upper surface of the base plate 64. By this arrangement, the base plate 64 acts as both a sturdy support for the carrier 72 and as a heat conductor for transmitting heat to the WUT 50 during burn-in.

The contactor 62 includes a backing plate 74 and an interconnect substrate 76 mounted to the backing plate 74. The backing plate 74 may be operably connected to a temperature control unit (not shown) so the contactor 62 can be maintained at a constant temperature as the temperature of the WUT 50 is raised during burn-in. A plurality of contactor units 78 are mounted to the interconnect substrate 76 via a joining material such as solder. The interconnect substrate 76 is preferably a silicon, ceramic, or Pyrex wafer having substantially the same coefficient of expansion as the contactor units 78. Each contactor unit 78 has a plurality of electrically conductive contact elements 80. The contact elements 80 may be rigid pins, conductive pads or, preferably, the resilient spring contact elements disclosed in commonly-owned, copending U.S. patent application Ser. No. 08/452,255 filed May 26, 1995, which is incorporated herein by reference. See also U.S. Pat. No. 5,600,257 for another example of a contactor system.

The contactor 62 is attached within the burn-in receptacle 60 by mounting an upper surface of the backing plate 74 to a lower surface of the upper plate 68 of the burn in receptacle 60 such that the contact elements 80 of the contactor units 78 align with a plurality of electrically conductive test points, terminals, or pad elements 82 formed on the DUTs 52 of the WUT 50. Alignment between the test points 82 and the spring contact elements 80 is maintained by the guide posts 66 and by the matched coefficient of thermal expansion between the interconnect substrate 76 and the WUT 50. Circuitry 84 is provided within the upper plate 68 of the burn-in receptacle 60 and the backing plate 74 and interconnect substrate 76 of the contactor 62 to electrically connect the contactor units 78 to a host test control unit 86.

In operation, the WUT 50 and the contactor 62 are brought together by actuating the fasteners 70 of the burn-in receptacle 60 until the tips of the spring contact elements 80 engage the test points 82 of the DUTs 52. As discussed above, the compression stop 71 prevents the upper plate 68 and attached contactor 62 from traveling too close to the base plate 64 and mounted WUT 50, thereby avoiding compression damage to the DUTs 52 and the spring contact elements 80.

The burn-in receptacle 60 is then placed within a burn-in chamber (not shown) to exercise the WUT 50. Heat may be applied or removed according to methods well known for burn-in. The environment of the chamber can be heated or cooled. The base plate 64 of the burn-in receptacle 60 may heat or cool the WUT 50. Operation of DUTs 52 typically will generate heat, sometime considerable heat. Backing plate 74 of the contactor 62 may heat or cool the contactor units 78. In general, it is desirable to maintain the contactor units at a relatively cool temperature, thereby extending the operating life of the contactor units 78.

Some sort of thermal isolation between the contactor units 78 and the DUTs 52 is desirable, although not always possible. The burn-in receptacle 60 may be designed to be airtight and to have a vacuum interface such that the WUT 50 can be exercised under partial vacuum, high vacuum, or otherwise controlled atmospheric conditions. The presence of a vacuum would increase the thermal isolation between the contactor units 78 and the DUTs 52.

After a burn-in temperature is reached, the host test control unit 86 can exercise the DUTs 52 by communicating with the DUTs 52 via the contactor units 78. More particularly, the host test control unit 86 can signal all of the contactor units 78 to exercise all of the DUTs 52 in parallel, or can signal a subset of the contactor units 78 to exercise a portion of the DUTs 52 on the WUT 50. In addition, the host test control unit 86 can signal a first subset of the contactor units 78 to perform a first test (e.g., AC parametric) while signaling a second subset of the contactor units 78 to perform a second test (e.g., DC parametric or functional).

The whole wafer contactor illustrated in FIG. 2 is particularly useful with the present invention. In addition, a traditional probe card can benefit from the present invention. Referring now to FIG. 1A (discussed above), a conventional probe card with resilient contact elements is shown. Such a probe card can be fabricated with a generally large number of contacts 524 using the techniques of the present disclosure.

Figure 3:
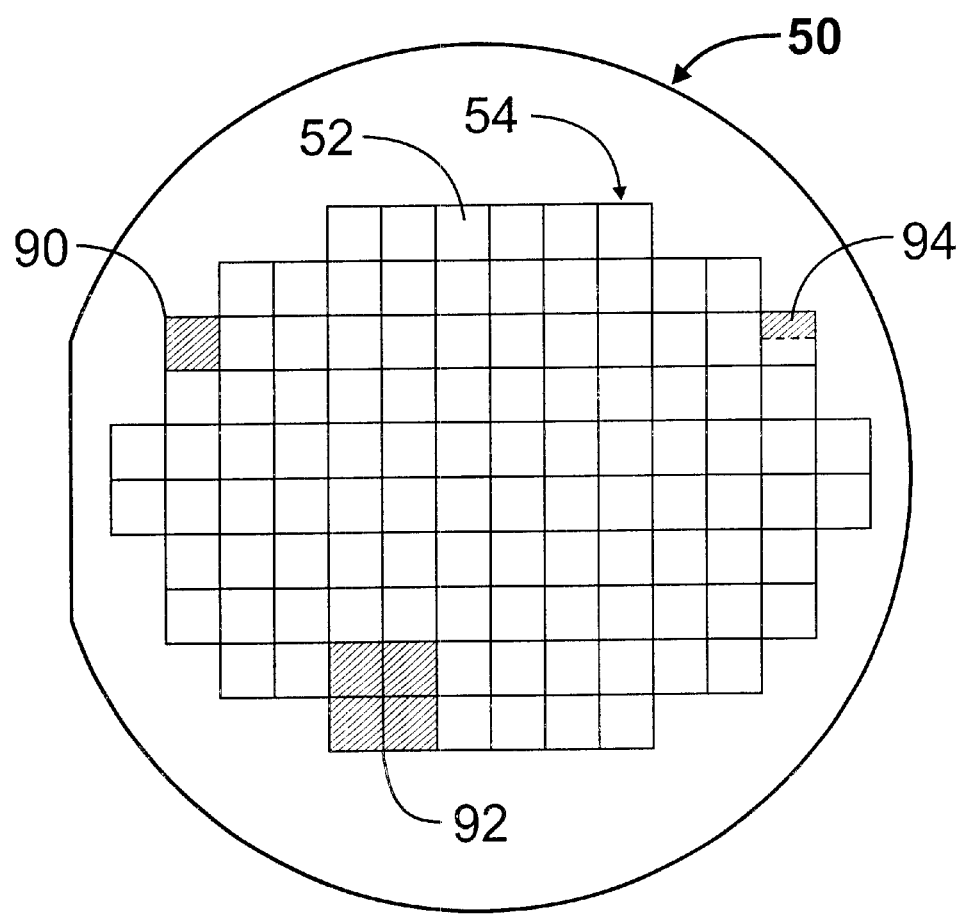
FIG. 3 is a diagrammatic top plan view of a WUT illustrating possible footprints of a contactor unit of the present invention.

Referring now to FIG. 3, there are a number of possible contactor unit "footprints" including the three contactor unit footprints shown. A first contactor unit footprint 90 corresponds to a one-to-one ratio between a DUT 52 and a contactor unit 78. A second contactor unit footprint 92 corresponds to a one-to-four ratio between a contactor unit 78 and four DUTs 52. A third contactor unit footprint 94 corresponds to a two-to-one ratio between two contactor units 78 and a DUT 52. Although only three footprints 90, 92, and 94 are shown, it is considered within the scope of the invention to have alternative ratios between the DUTs 52 and the contactor units 78. In general, it is necessary to connect to most or all of a DUT in order to test it. However, certain tests might not require contacting all of the DUT. In addition, multiple contactors can be activated simultaneously in a coordinated fashion to test a DUT, even though a single contactor may connect to only a portion of a given DUT. Preferably, some number of DUTs can be contacted at the same time. In particular, a contactor that contacts all of the DUTs is particularly useful.

As discussed hereinabove, probe elements (e.g., spring contact elements, pads, terminals, and the like) can be mounted directly to the surface of the interconnect substrate 76 of a probe card assembly. This approach, however, has certain inherent limitations. The interconnect substrate can typically include a relatively expensive substrate upon which to fabricate spring (probe) elements. Yield problems may be experienced in the process of fabricating composite interconnection elements on the surface thereof resulting, at best, in difficult (i.e., time-consuming and expensive) reworking of the space transformer component. Additionally, it is a costly proposition to design different interconnect substrates for each and every testing application.

According to an aspect of the present invention, probe elements are fabricated on relatively inexpensive substrates, termed "contactor units" herein. These contactor units are readily attached, mounted, or joined to the surface of an interconnect substrate and electrically connected to the terminals thereof, such as by soldering, with a Z-axis conductive adhesive, flex cable, or COB (chip on board). A plurality of such contactor units can be attached and connected to a single interconnect substrate component to effect wafer-level contacting for, e.g., testing. The contactor units can be single layer substrates, or can be multi-layer substrates effecting a degree of space-transformation. The Z-axis spacing between the contactor units and the surface of the interconnect substrate is readily controlled by the volume of solder, Z-axis adhesive, or the like, used to make the attachments/connections.

A plurality of contactor units having spring contact elements fabricated on a surface thereof can be fabricated from a single, inexpensive substrate such as a ceramic wafer, which is subsequently diced to result in a plurality of separate, preferably identical contactor units which can be individually mounted to the surface of an interconnect substrate.

For wafer-level testing (including burn-in), a plurality of such contactor units upon which spring (probe) elements have been fabricated can be attached/connected to a single, large interconnect substrate component to effect wafer-level probing (testing) of an entire semiconductor wafer in a single pass.

An advantage to the technique of using contactor units, rather than fabricating spring contact elements directly upon the surface of the interconnect substrate, is that the interconnect substrate is readily reworked simply by replacing selected ones of the one or more contactor units attached/connected thereto.

While a specific implementation of the invention in the form of a testing device has been described above, it should be apparent that the contactor units of the present invention have a much wider application and the above-described specific embodiment should be considered as merely illustrative and not as limiting of the scope of the invention.

Figure 4A:
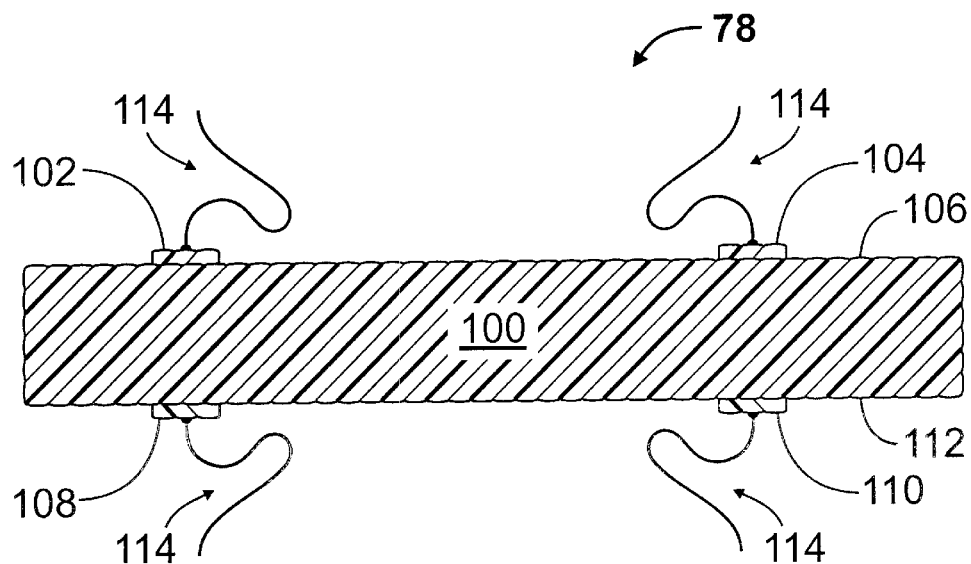
FIGS. 4A–4E are cross-sectional views of various embodiments of the contactor unit of the present invention.

Referring now to FIGS. 4A–4E, various embodiments of the contactor unit 78 of the present invention are shown. Turning now to FIG. 4A, a generic embodiment of the contactor unit 78 is illustrated. Generally, an insulating substrate 100, such as a PCB-type substrate, is provided with a plurality of terminals 102 and 104 (two shown of many) on one surface 106 thereof, and a like plurality of terminals 108 and 110 on an opposite surface 112 thereof. Spring contacts 114 are mounted on the terminals 102 and 104, respectively, and spring contacts 114 are mounted on the terminals 108 and 110, respectively.

The substrate can be any of a variety of materials. An organic material is useful, often in the form of a printed circuit board. A variety of ceramic materials are useful as well. Silicon is a useful substrate, although in some designs it must be passivated in some regions so as to be nonconductive. It is particularly advantageous to use a material with a coefficient of thermal expansion comparable to silicon so as to remain closely aligned with a silicon device no matter what temperature changes may influence the environment.

As noted in commonly-owned, copending U.S. patent application Ser. No. 08/554,902, filed Nov. 9, 1997 (status: issued Nov. 2, 1999, as U.S. Pat. No. 5,974,662), the contactor unit may comprise distinct sets of spring elements on each side thereof (see FIG. 3A in Ser. No. 08/554,902), or may comprise single spring elements supported (such as by solder or elastomer) in holes extending through the support substrate 100 (see FIGS. 3B and 3C in Ser. No. 08/554,902). Such a unit with a spring element on each side (or passing through the substrate) is often called an interposer.

It should be clearly understood that any resilient interconnection element (spring) can be employed, including monolithic spring elements made of materials that are inherently springy, such as nickel, phosphor bronze and beryllium copper. This is true of several of the embodiments disclosed herein illustrating composite interconnection elements. A particularly useful structure has springs on one side, and suitable connection means on the opposite side of the substrate. See FIG. 4E.

The present invention is also applicable to forming interconnection elements which are formed of soft metal sheets which are patterned (such as by stamping or etching), into flat elongate elements (tabs, ribbons) and coated with a hard material.

In a particularly preferred embodiment, the interconnection elements are formed by bonding a soft wire to a suitable substrate, forming the wire into a suitable, springable shape, then overcoating the wire with a hard material. This subject is elaborated upon in the parent specification, commonly-owned, U.S. Pat. No. 5,806,181.

Generally, in the context of a probe card assembly, it is preferable for all of the probe elements (e.g., resilient contact structures, solder balls, rigid pins or pads) to have the same length as one another, to ensure constancy in the plurality of signal paths involved.

Figure 4B:
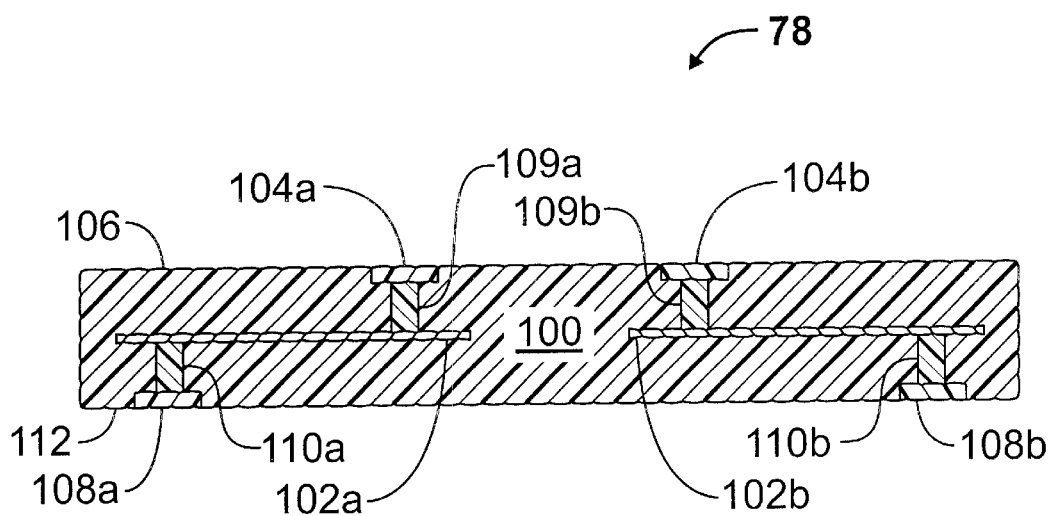

Turning now to FIG. 4B, an exemplary design of a contactor unit 78 (spring elements omitted for illustrative clarity) is illustrated. The contactor unit 78 has a top (as viewed) surface 106 and a bottom (as viewed) surface 112, and is preferably formed as a multi-layer component having alternating layers of insulating material (e.g., ceramic) and conductive material. In this example, one wiring layer is shown as including conductive traces 102a and 102b (two shown of many).

A plurality of terminals 104a and 104b (two shown of many) are disposed on (or recessed within) the top surface 106 of the contactor unit substrate 100 and a plurality of terminals 108a and 106b (two shown of many) are disposed on (or recessed in) the bottom surface 112 of the contactor unit substrate 100. The top terminals 104a and 104b are connected to the corresponding bottom terminals 108a and 106B, respectively, by associated conductors 109a/110a and 109b/110b, respectively, connecting the terminals to the conductive traces 102a and 102b, respectively. This is all generally well known in the context of multi-layer land grid array (LGA) support substrates and the like. FIG. 4B illustrates just one of many ways for interconnecting the terminals on one surface of a substrate with corresponding terminals on another surface of the substrate.

Figure 4C:
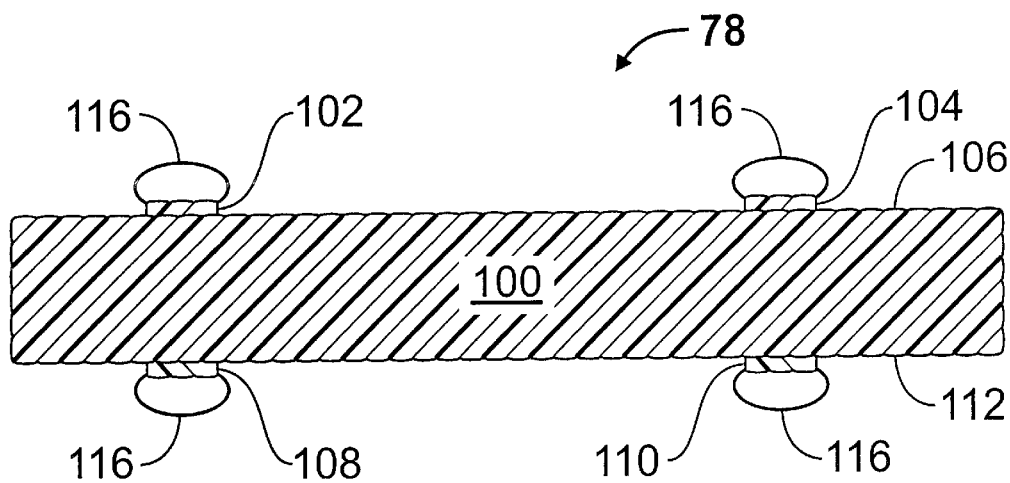

Turning now to FIG. 4C, another embodiment of the contactor unit 78 includes a plurality of solder ball elements (or solder bumps) 116 mounted to the terminals 102, 104, 108, and 110. The solder ball elements 116 can be connected to the terminals of a support substrate or an interconnect substrate such that solder joints are formed between the terminals of the contactor unit 78 and the terminals of the support substrate or interconnect substrate.

Figure 4D:
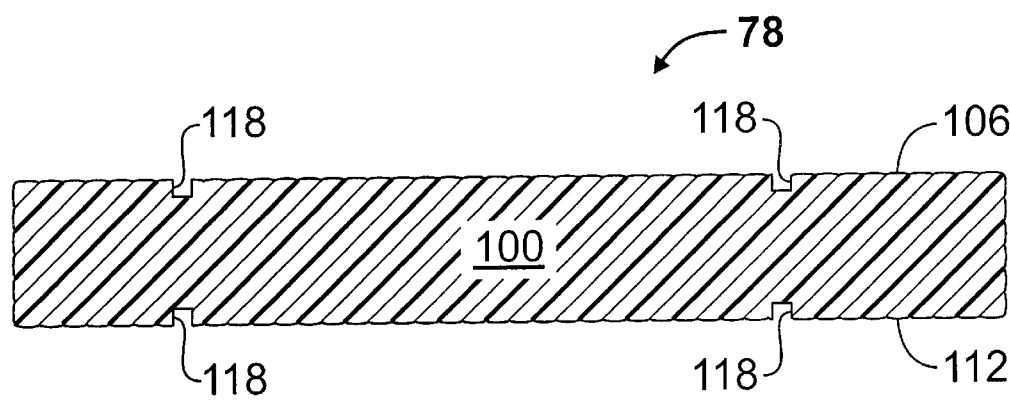

Turning now to FIG. 4D, a further embodiment of the contactor unit 78 includes a plurality of recessed terminals 118 (four shown of many) disposed in the upper and lower surfaces 106 and 112 of the contactor unit 78. The recessed terminals 118 can engage the spring elements or rigid pins of a support substrate or an interconnect substrate.

Figure 4E:
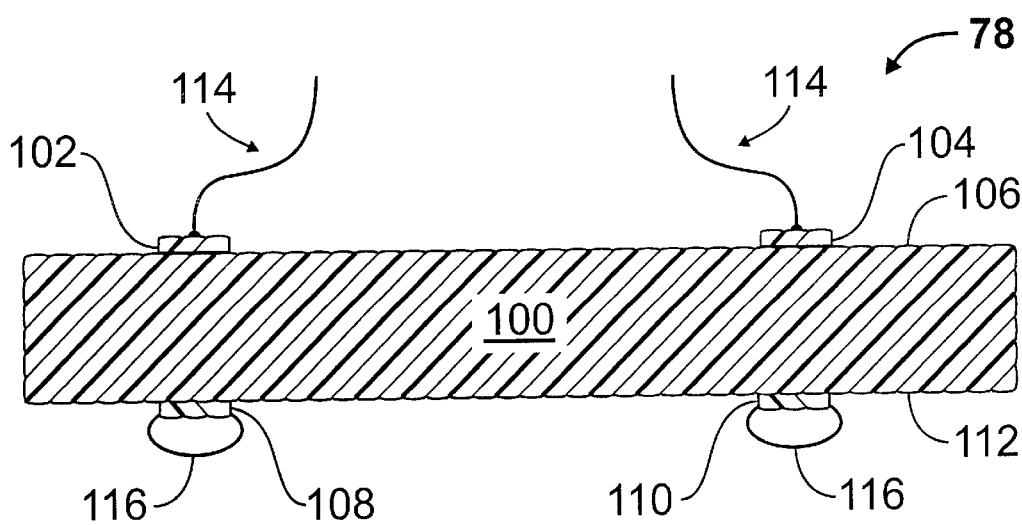

Turning now to FIG. 4E, yet another embodiment of the contactor unit 78 includes solder ball elements 116 on the lower surface 112 thereof and spring elements 114 on the upper surface 106 thereof Although only spring elements 114 and solder ball elements 116 are illustrated, it is considered within the scope of the invention to provide contactor units 78 having an arbitrary mix of terminals such as rigid pins, conductive pads, solder ball elements, spring elements, recessed terminals, or the like.

Referring to FIGS. 5A–5F, two methods of fabricating the contactor of the present invention are shown. For the sake of continuity of illustration, the structures in these figures are all shown having the same orientation. In actual practice, however, various of the structures of FIGS. 5A–5F could be upside down compared to the orientations shown in the figures. The contactor units 78 could rest on the substrate 76 while the joining material 134 is liquefied, the contactor units 78 are aligned, and then the joining material 134 is hardened. As will be seen in the following discussion, various orientations may be suitable for specific applications.

EXAMPLE
One Adjustment Region, Self Aligning Contactor Units

Figure 5A:
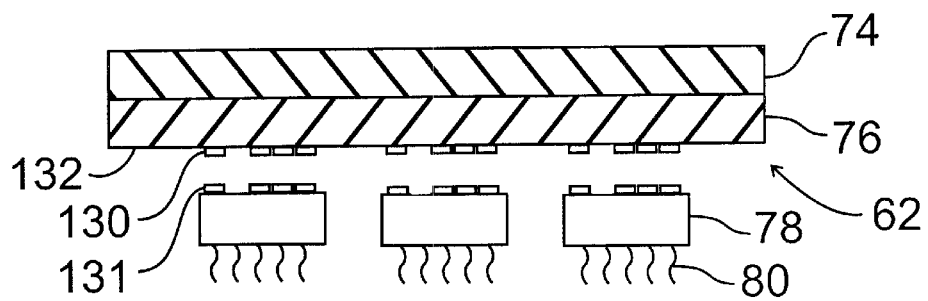
FIGS. 5A–5C are side elevational views, partially in section, of steps in a method of mounting contactor units of the present invention on a substrate.

Referring now to FIG. 5A, the interconnect substrate 76 is initially mounted to the backing plate 74. The interconnect substrate 76 is preferably a silicon, ceramic, or Pyrex wafer having substantially the same coefficient of expansion as the contactor units 78. Matching the coefficient of expansion between the interconnect substrate 76 and the contactor units 78 facilitates the alignment and positioning of the contactor units 78 on the interconnect substrate 76 over a range of environmental conditions during the life of the contactor 62.

The interconnect substrate 76 has a plurality of attachment areas 130 on a lower surface 132 thereof. The attachment areas 130 preferably are coordinated with the contactor units 78 so the probe elements 80 of contactor units 78 align with the terminals of die resident on a wafer. Typically, each contactor unit has a plurality of terminals on the side opposite the probe elements 80. Attachment area 130 comprises a corresponding array of terminals to match up with each contactor unit 78. A typical contactor unit 78 might have on the order of 100 to 2000 probe elements 80, each connected to a terminal 108 (see FIG. 4B) on one side of the contactor unit. In a preferred embodiment, the contactor unit has a corresponding number of terminals 104 on the opposite side. These terminals 104 might be in a regular array, or, preferably, some sort of specialized pattern to key the contactor unit to the interconnect substrate 76. See terminals 131 in FIG. 5A, 5B and 5C, similar to terminals 104 in FIG. 4B. Note that terminals 131 are not in a regular array, thus providing an alignment key. The terminals themselves can take a variety of shapes including square, rectangular, and cruciform.

Note that the connection between contactor unit and the interconnection substrate may or may not make an electrical connection as well. In one preferred embodiment, there are relatively few or no electrical contacts on the side of the contactor unit opposite the probe elements, but rather some number of mechanical alignment and securing pads. The bulk of the discussion here focuses on the mechanical aspects of joining the contactor unit to the interconnection substrate. Where this joining is by means of a conductive material, this connection may be part of an electrical circuit. However, the joining may be merely mechanical and form no part of an electrical circuit, even if the joining is between metallic terminals on each of the contactor unit and the joining material is electrically conductive.

The number of joining pads may vary considerably. Theoretically, a single joining pad would be useful. In one preferred form, three or more joining pads are provided on the contactor unit and the interconnection substrate. In another preferred form, there are more than 20 joining pads, preferably forming electrical connections between the contactor unit and the interconnection substrate. This number can easily be in the hundreds of connections, or more. Note that there may be no "joining pads" at all, as, for example, where the contactor unit is secured to the interconnection substrate by an adhesive such as epoxy or underfill.

One preferred interconnect substrate is silicon. A large number of terminals forming attachment areas 130 can be fabricated on the substrate using conventional semiconductor processing techniques, such as sputtering, CVD, PVD, and the like. Alternatively, the interconnect substrate could be ceramic, and suitable metalized terminals can be fabricated using suitable techniques. Note that making simple terminals is a high yield process and is lithographically precise over the entire field of the interconnect substrate. For an interconnect substrate of silicon, the terminals might be roughly square contacts of 10 mil (250 micron) by 10 mil dimension. These can be defined to within 0.1 micron positional accuracy or better over the entire surface of an 8 inch (200 cm) silicon wafer. Securing contactor units to various regions of the interconnect substrate will position the contactor units relative to each other within the accuracy of the connection mechanism plus the accuracy of the interconnect substrate alignment elements.

A plurality of contactor units 78 are fabricated and tested and have a plurality of spring contact elements 80 mounted on a lower surface thereof. The spring contact elements 80 are preferably mounted to each contactor unit 78 such that the spring contact elements 80 of each contactor unit 78 align with a plurality of test points (not shown) provided on a DUT.

Figure 5B:
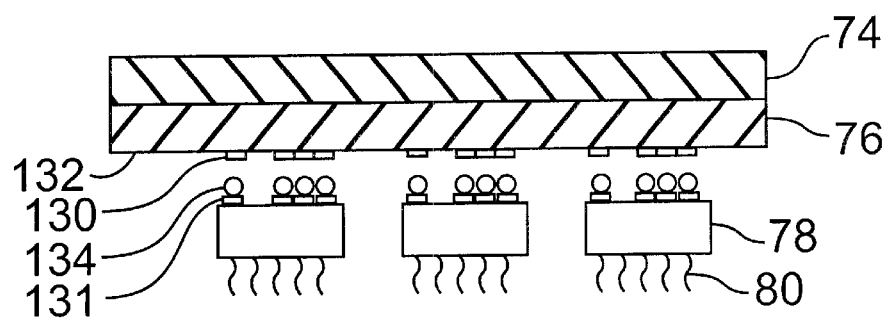

Referring now to FIG. 5B, a contactor unit joining material 134, such as a solder or brazing paste, is applied to the upper surface of each contactor unit 78. Alternatively, a suitable adhesive (not shown), preferably thermally-conductive, is disposed on the upper surface of each contactor unit 78. An example of a suitable adhesive is silver-filled epoxy, and the adhesive preferably should be of a type that permits a contactor unit to be removed (such as with a suitable solvent, or with heat) and replaced.

Figure 5C:
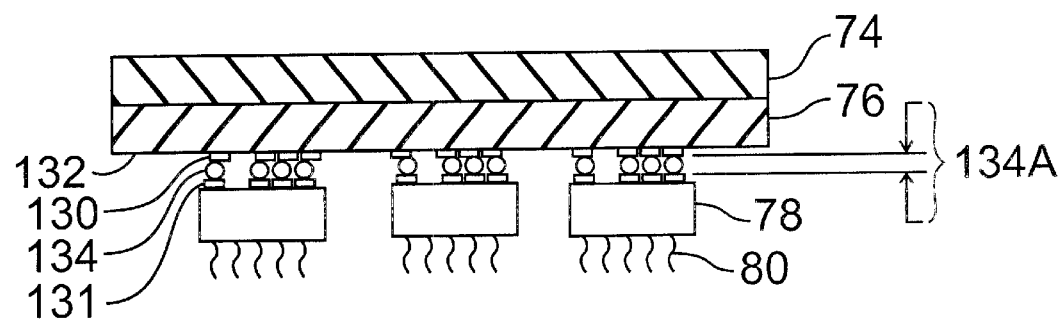

Turning to FIG. 5C, each contactor unit 78 is then mounted to a corresponding attachment area 130 via the contactor unit joining material 134. As shown in FIG. 5C, the contactor units 78 are not necessarily in optimal alignment with their corresponding attachment areas 130 after the mounting process is complete. In particular, the contactor unit can be offset in the y-axis, offset in the x-axis, offset in both the x-axis and the y-axis, or angularly offset. The misalignment can be improved in a first instance merely by a reflow process to be described in reference to FIGS. 5D–5G, letting surface tension pull the two structures into the lower energy state of correct alignment. Adjustment region 134A between each attachment area 130 and a corresponding terminal 131 is where this alignment is adjusted. Alignment with aids, such as aligning tip structures 140, allows more precise refinement of this positioning, but reflowing alone can allow for reasonably precise alignment.

Figure 5D:
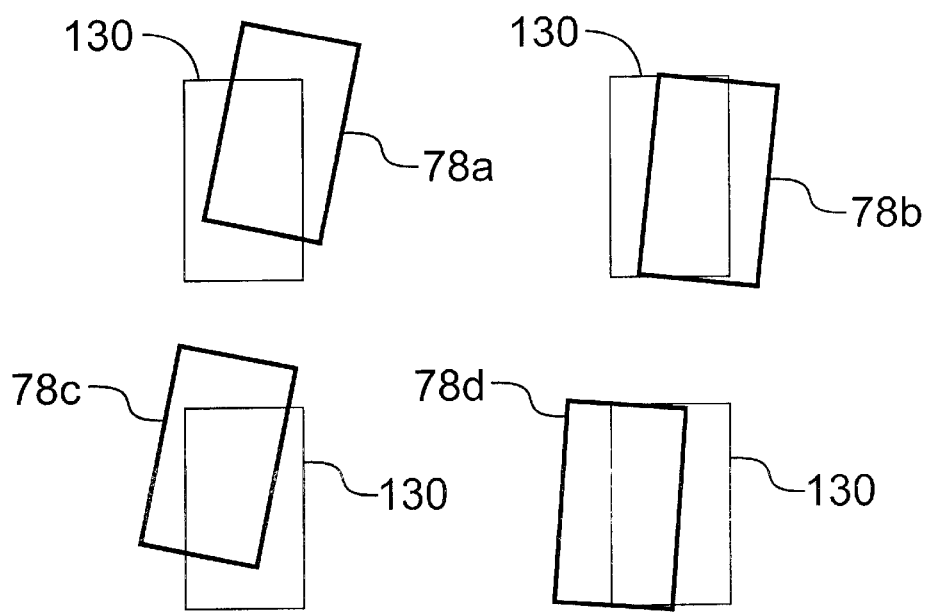
FIG. 5D is a diagrammatic top plan view illustrating a contactor unit in less-than-optimal alignment with underlying attachment areas on a substrate.

Referring to FIG. 5D, an individual contactor unit generally has plurality of terminals 78a, 78b, 78c, 78d, or connectors to be aligned with corresponding attachment areas 130 in the adjustment region or alignment region of the interconnect substrate 76. FIG. 5D illustrates an angular and X-Y offset between the two components. By joining the corresponding terminals with a suitable joining material, if the joining material can enter a malleable state, the corresponding terminals can be repositioned relative to each other. In particular, if the joining material has a significant surface tension and is in a malleable state, each corresponding pair of terminals will tend to self-center. The collective force of the surface tension between each pair will tend to bring the individual contactor unit into relatively accurate alignment with the interconnect substrate. In Figure D, the terminals will tend to rotate counterclockwise around an axis that will more or less precisely align terminals 78 with terminals 130. This is described in more detail in connection with FIGS. 6A and 6B.

Thus it can be seen that a primary mode of alignment is to provide a first alignment region with some means for directing the contactor units into a preferred alignment with the interconnection substrate. A first order placement is the mechanical alignment of the contactor unit into reasonable proximity to the desired final position. This can be by hand or with a manipulation device such as a handler. Using surface tension alignment of a suitable malleable material as described above can position each contactor unit within about 0.5 mil (12.5 micron) accuracy relative to the interconnection substrate. Where multiple contactor units are secured to the same interconnection substrate and the reference alignment pads on the interconnection substrate are accurate to better than 1 micron, this gives a probe element alignment accuracy of about 1 mil (25 microns) between any two probe elements, on different contactor units (essentially between any probe elements on the entire collective assembly).

EXAMPLE

Two Adjustment Regions, Self Aligning

The positional accuracy of each contactor unit can be improved by including other alignment mechanisms, discussed below in more detail. In general, a precisely positioned reference is used to improve the alignment of the contactor unit. This reference can be provided in a variety of ways.

Still another way to improve accuracy of positioning is to include a precisely defined component of the contactor system for the probe elements. Copending, commonly assigned U.S. application Ser. No. 08/819,464, filed Mar. 17, 1997 (status: CPA filed Oct. 17, 1999, CPA pending) incorporated herein by reference, discloses an array of contact tip elements (tip structures) fabricated on a sacrificial substrate, then joined by soldering, brazing and the like to the ends of contact elements such as resilient contact elements. Since the tip structures are precisely defined in relation to each other, transferring the tip structure array to contact elements then freeing the tip structures (as by removing a sacrificial substrate) while maintaining the relative accuracy of positioning gives a highly precise array of tip structures on the resilient contact elements.

This same general technique can be extended to a large array of contact elements. If the contact elements are provided on a series of contactor units, the tip structures can be provided in a larger array, preferably up to full wafer in size.

Figure 5E:
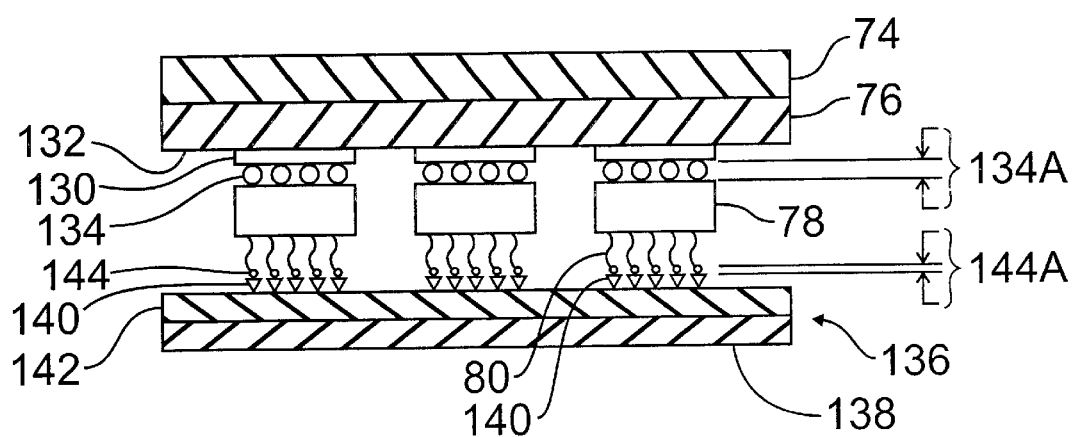

Referring now to FIG. 5E, a tip substrate 136 is shown. The tip substrate 136 serves two purposes. First, the tip substrate 136 facilitates the alignment of the contactor units 78 on the attachment areas 130 during the reflow process, as discussed below. Second, the tip substrate 136 provides a plurality of tip structures 140 for attachment to the free ends of the resilient contact elements 80. In this regard, some tip structures 140 may have alignment means, such as indentations (not shown) on the backs of the tip structures 140, to facilitate the engagement of the tip structures 140 with the free ends of the resilient contact elements 80. The tip structures 140 are, preferably, the tip structures disclosed in U.S. patent application Ser. No. 08/819,464, mentioned above. Other useful tip structures are disclosed in commonly-owned, copending U.S. patent application Ser. No. 08/452,255 filed May 26, 1995, which is incorporated herein by reference.

The tip substrate 136 includes a silicon base plate 138 and the plurality of tip structures 140 mounted to the base plate 138 via a sacrificial layer 142. The sacrificial layer 142 is preferably an anti-wetting material that prevents a tip structure joining material 144 from bridging between adjacent tip structures 140 during the reflow process discussed below. Additionally, the sacrificial layer 142 preferably serves as a release layer that can be etched away after the tip structures 140 have been attached to the resilient contact elements 80. One material that meets both requirements for the sacrificial layer is aluminum.

Once the tip structure joining material 144, such as a solder or brazing paste, is applied to the free ends of the plurality of tip structures 140, the tip structures 140 are physically positioned to contact the free ends of the resilient contact elements 80 in the adjustment region 144A. However, as noted with respect to attaching the contactor units 78 onto the attachment areas 130, the optimal alignment of the tip structures 140 and the resilient contact elements 80 is often not achieved after the initial positioning of the tip structures 140 on the free ends of the resilient contact elements 80.

Figure 5F:
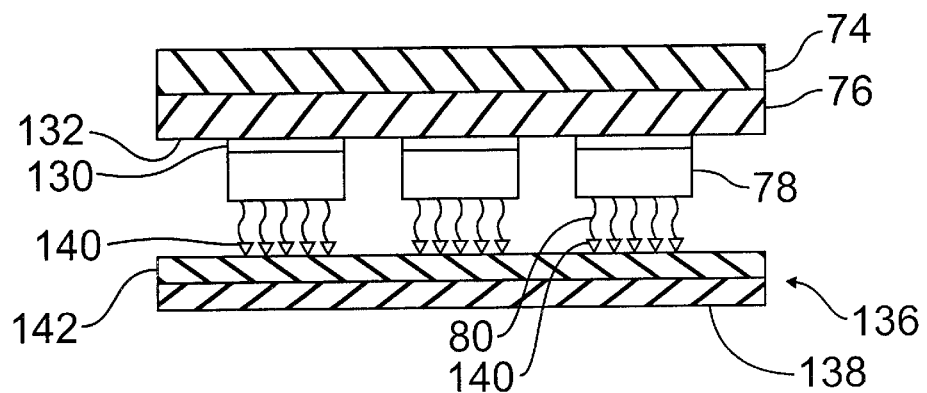

Referring now to FIG. 5F, the backing plate 74, interconnect substrate 76, contactor unit 78, and tip substrate 136 assembly is subjected to a reflow process after the tip structures 140 are mounted to the resilient contact elements 80. The reflow process consists of passing the assembly through a chamber to reflow the contactor unit joining material 134 and the tip structure joining material 144. The assembly is passed through the chamber allowing freedom of movement between the attachment areas 130 and the contactor units 78 as well as between the resilient contact elements 80 and tip structures 140 in the X, Y, and Z planes. During the reflow process, the contactor units 78 self-align on the attachment areas 130 and the tip structures 140 self-align on the resilient contact elements 80 due to the surface tensions of the contactor unit joining material 134 and the tip structure joining material 144.

Figure 5G:
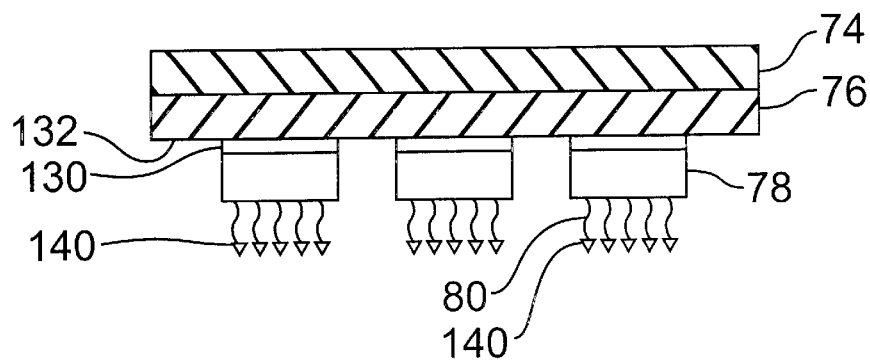

Referring now to FIG. 5G, the tip structures 140 are released from the tip substrate 136 by removing the sacrificial layer 142. A preferred method of release is using a suitable etchant to etch away the sacrificial layer without damaging the tip structures 140. For example, an aluminum etchant can be used to etch away an aluminum sacrificial layer. After the sacrificial layer is removed, the silicon base plate simply disengages, resulting in the large scale contactor of the present invention.

In this process, the interconnect substrate includes alignment pads which are precisely positioned within lithographic process limits, typically on the order of 0.1 micron or better. In addition, the tip structures 140 are precisely positioned within lithographic process limits on the sacrificial substrate. The interconnection and tip structure substrates may be positioned specifically, relative to each other. In one preferred embodiment, these substrates are precisely aligned and fixed in position using a suitable alignment technique, as known in the industry. During reflow, the contactor units "float" between these two references.

In a second preferred embodiment, one substrate, for example the interconnect substrate, is fixed in position as by placing it on a support member. The contactor units are then positioned approximately atop the interconnection substrate and the tip substrate is simply placed atop the contactor units. When subjected to reflow, the presence of the tip substrate will still impact the alignment of the contactor units and the overall alignment process. Thus the contactor units "float" on the interconnection substrate and the tip substrate "floats" on the contactor units.

When the contactor units 78 are allowed to find a neutral position during reflow, the net result of surface tension forces between two highly accurate defining regions should improve the positional accuracy of each contactor unit by 50% or better. Compared to the positioning achieved with a single adjustment region in the example described above, the relative positional accuracy of probe elements on separate contactor units should be at least 50% better, or on the order of 0.5 mil between any two probe elements over the entire interconnect substrate.

Self Alignment

Figure 6A:
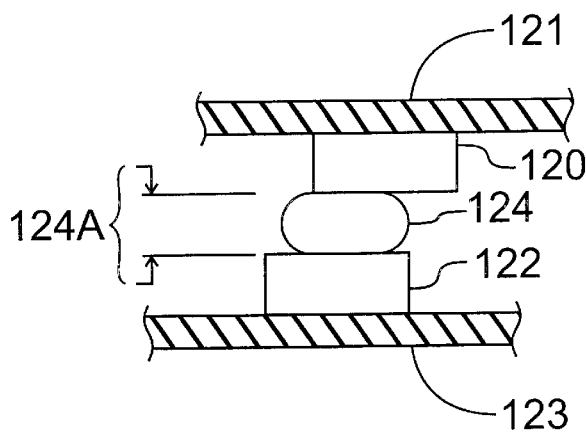
FIGS. 6A and 6B are side elevational views, partially in section, illustrating self-aligning terminals connected via a solder paste during a solder reflow process.
Figure 6B:
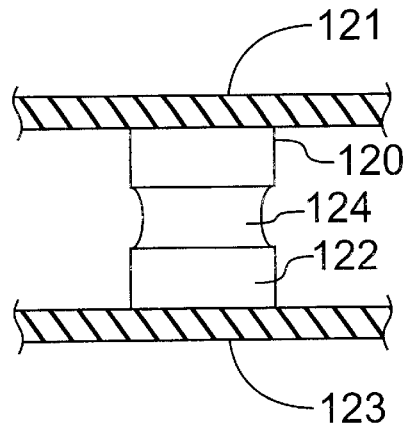

Referring now to FIGS. 6A and 6B, the self-alignment of terminals connected via a solder paste is shown. As shown in FIG. 6A, and discussed in FIG. 5D, terminals 120 and 122 may not be in optimal alignment after the terminals 120 and 122 are connected via a solder paste 124 in the adjustment region 124A. This less-than-optimal alignment may be the result of many factors, including the limits of precision obtainable using human or machine positioning. Turning now to FIG. 6B, the terminals 120 and 122 may be brought into alignment by subjecting the solder paste 124 to a solder reflow process. During the solder reflow process the solder paste 124 liquefies and the surface tension of the liquid solder tends to center the terminals over the liquid solder, bringing them into alignment. Of course there may be opposing forces that will prevent or limit this optimal alignment. For example, if terminals 120 and 122 are 4-mil (100 $\mu$m) pads that are connected via a solder paste 124, and assuming there are no significant opposing forces, then the terminals 120 and 122 will be pulled into alignment by the surface tension of the liquid solder during the reflow process. The accuracy of this alignment is generally on the order of one half to one mil (12.5–25 $\mu$m).

Note that many liquids exhibit some degree of surface tension. This is well understood in chemistry, and includes the balance of forces on a molecule of liquid between nearby molecules of liquid and any other nearby materials, such as the body of an electrical contact pad. If there is a significant affinity for both the liquid and the nearby material, there may be significant surface tension. In the present application, this affinity for "self" and for the contact pads will create aligning forces that keep the liquid and the connected pads in the closest proximity, thus tending to center the pads relative to each other. Please note that solder does this, as may certain conductive epoxies. The conditions under which a material is fluid and has a suitable surface tension also will vary with the material. For example, an epoxy would typically be fluid at relatively lower temperatures, such as room temperature, and would cure at a higher temperature, whereas solder is relatively solid at room temperature and liquid at elevated temperatures. Selection of specific materials is left to one skilled in the art.

EXAMPLE

One Adjustment Region, With Alignment Substrate

Figure 7A:
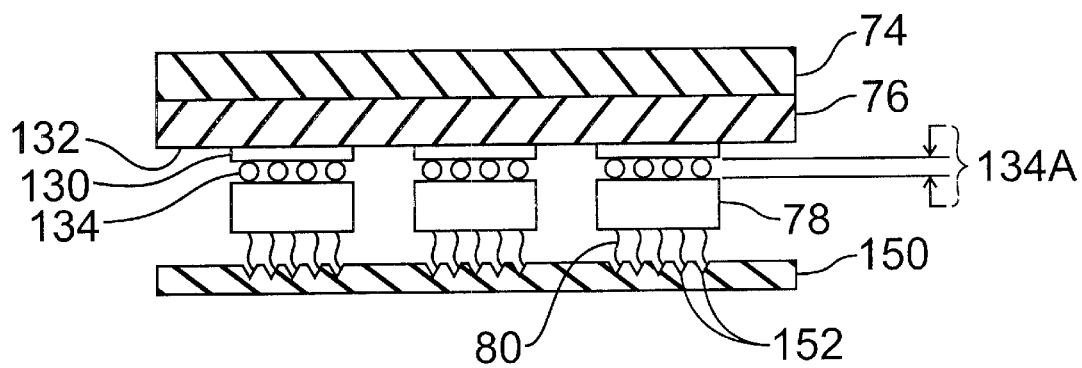
FIGS. 7A–7B are side elevational views, partially in section, of steps in an alternative method of fabricating the contactor of the present invention.
Figure 7B:
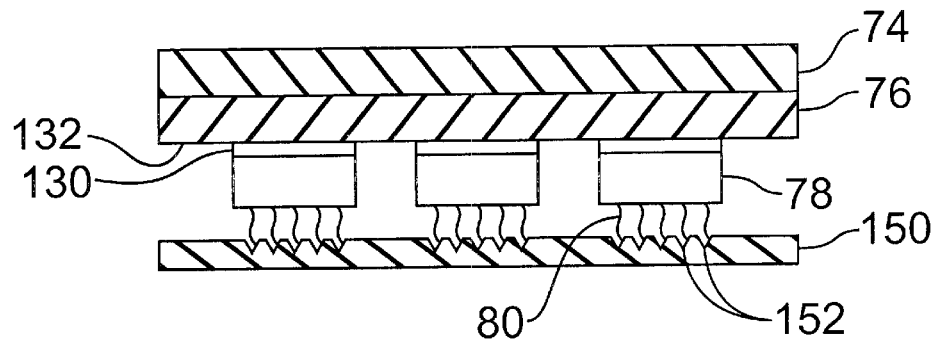

Referring to FIGS. 7A–7B, an alternative method of fabricating the contactor of the present invention is shown. Initially, the contactor units 78 are mounted to an interconnect substrate 76, as described and shown in FIGS. 5A–5C. Referring now to FIG. 7A, an alignment substrate 150 is brought into engagement with the mounted contactor units 78 such that a plurality of indentations 152 formed in the alignment substrate 150 engage the resilient contact elements 80 of the contactor units 78. The indentations 152 are formed in the alignment substrate 150 such that the indentations 152 correspond to a plurality of contact points of die resident on a wafer (not shown). A useful alignment fixture has an array of pyramidal pits to receive a resilient contact element. Such pits can be created by anisotropic etchant such as KOH on silicon, as is well known in the art and described in Ser. No. 08/819,464, noted above. Defining pits in this manner can be lithographically precise over an entire wafer.

Since the attachment areas 130 are also placed to conform with the specific design of contactor units 78 and the resilient contact elements 80, the engagement of the indentations 152 with the resilient contact elements 80 cause the contactor units 78 to align with their associated attachment areas 130 in the adjustment region 134A when the backing plate 74, interconnect substrate 76, contactor unit 78, and alignment substrate 150 assembly undergoes the reflow process discussed below.

Referring now to FIG. 7B, the backing plate 74, interconnect substrate 76, contactor unit 78, and alignment substrate 150 assembly undergoes a first reflow process after the indentations 152 engage the resilient contact elements 80. As before, the reflow process includes passing the assembly through a chamber to reflow the contactor unit joining material 134 interconnecting the contactor units 78 and attachment areas 130. However, the surface tension induced self-alignment feature of the contactor unit joining material 134 is not solely utilized to align the contactor units 80 on their associated attachment areas 130. Rather, the alignment substrate 150 is used to direct the alignment process. The alignment substrate 150 urges the contactor units 78 into alignment with their associated engagement areas 130 through the engagement of the resilient contact elements 80 with the indentations 152.

Depending on the precision of the contactor units and associated resilient contact elements, this alignment can be quite precise. The process is helped in that the reference positions of the contact elements are defined lithographically so the precision of placement from contactor to contactor is now on the order of the accuracy of the alignment substrate (easily better than 0.1 micron) plus any inaccuracy with a given contactor unit. If the resilient contact elements can be manufactured to within, say, 3 microns positional accuracy within a single contactor unit, then the difference between probe elements on two separate contactor units would be the sum of the tolerance on each contactor unit plus the reference, or about 6.1 microns (about ¼ mil). Of course if the resilient contact elements can be positioned more accurately, then the accuracy of the overall system improves as well.

EXAMPLE

Second, Independent Adjustment Layer—Adding Tip Structures

Figure 7C:
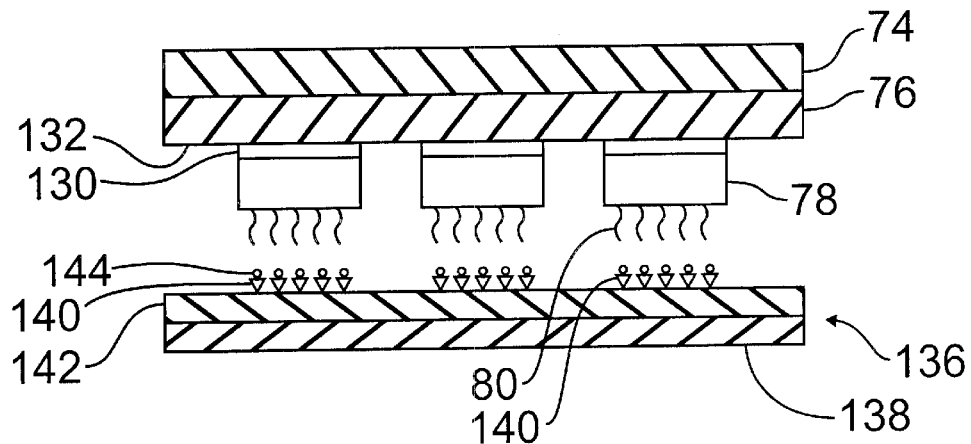
FIGS. 7C–7E are side elevational views, partially in section, of steps in another alternative method of fabricating the contactor of the present invention.

The carefully aligned contact elements of FIG. 7B may be useful as is, or they can be enhanced by adding tip structures. Referring now to FIG. 7C, the alignment substrate 150 is removed and the tip substrate 136 is brought into engagement with the mounted contactor units 80 after the first reflow process is complete. As discussed above, the tip structures 140 are connected to the resilient contact elements 80 via the tip structure joining material 144. The backing plate 74, interconnect substrate 76, contactor unit 78, and tip substrate 136 assembly is subjected to a second reflow process after the tip structures 140 are positioned to contact the resilient contact elements 80.

During the second reflow process, the assembly is passed through a chamber to reflow the tip structure joining material 144. Preferably, the second reflow process does not cause the contactor unit joining material 134 to reflow again. Therefore, the contactor unit joining material 134, preferably, has a higher reflow temperature than the tip structure joining material 144. Furthermore, the second reflow process is preferably carried out at a temperature between the reflow temperature of the tip structure joining material 144 and the reflow temperature of contactor unit joining material 134.

Figure 7D:
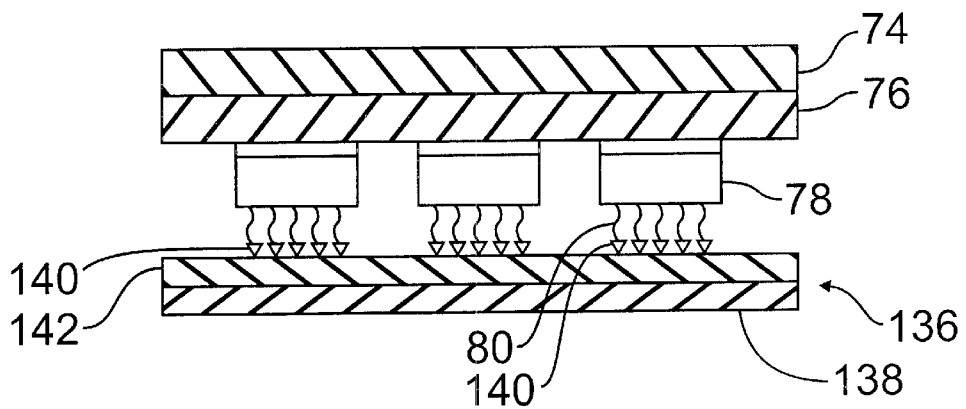
Figure 7E:
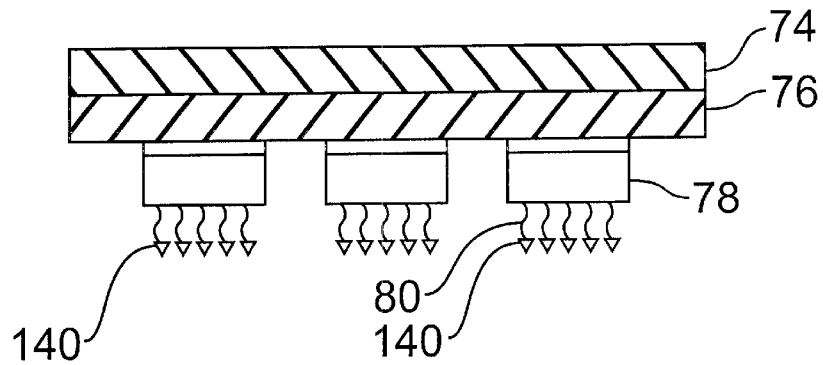

Referring now to FIGS. 7D and 7E, the tip structures 140 are released from the support substrate 136 by removing the sacrificial layer 142. A preferred method of release is using a suitable etchant to etch away the sacrificial layer 142 without damaging the tip structures 140. For example, an aluminum etchant can be used to etch away an aluminum sacrificial layer. After the sacrificial layer is removed, the silicon base plate simply disengages, resulting in the contactor of the present invention.

In this example, as in the two adjustment region example above, the tip structures are defined with great precision on the support substrate 136. Here, however, the resilient contacts have been pre-positioned to a high degree of accuracy, limited basically by the accuracy of resilient contact structures within each contactor unit.

In the two adjustment region example, any residual tension during the reflow process is taken between all active adjustment regions, including the interconnect substrate joining region, the tip structure joining region, the resilient contacts, and any forces of relative motion as in differing coefficients of thermal expansion in the components illustrated as well as in any supporting mechanism. When the tip structures are released, any residual forces are likely to cause some differential movement of the released contact elements, which in general will decrease the positional accuracy of the elements of the array.

In this two stage process of prealignment of the contactor units and subsequent tip attach, attaching the large tip structure substrate allows the tip structure substrate to find a lowest energy state relative to all resilient contact structures, with each resilient contact structures each starting its own lowest energy state. As before, when the tip structures are released, any residual forces are likely to cause some differential movement of the released contact elements, but in this instance such movement will be limited because the contact elements started in a very stable position, defined by the alignment substrate 150. This can give a resulting structure with positional accuracy on the order of the tip structure substrate itself. In this example, that is potentially less than 0.1 micron over the entire large contactor.

Note also the variation that a tip structure with a hole in the "back" (mentioned in regard to FIG. 5E) can be a useful alignment fixture as in FIG. 7B, and the entire unit can be assembled by applying solder paste to the tip structures, assembling otherwise as in FIG. 7B, reflowing to set the alignment region at 130 but also to reflow the solder paste at the tip structures so that the tip structures are soldered onto the spring tips in the same step. The sacrificial substrate is then removed to give spring tips in precise alignment but also with the tiles in good alignment as well.

EXAMPLE

Alignment Key

Figure 7F:
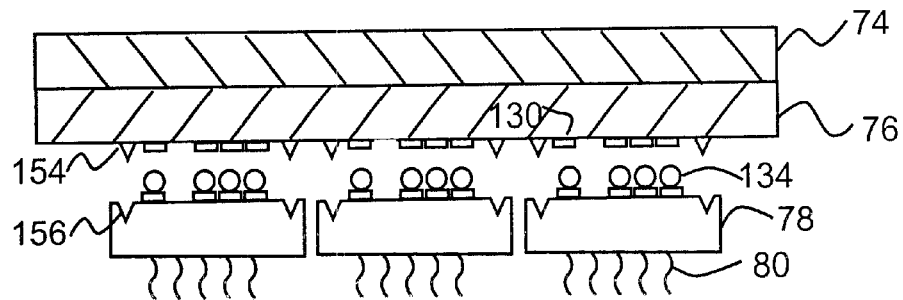
FIG. 7F illustrates a side elevational view, partially in section, of steps in another alternative method of fabricating the contactor of the present invention.

Note also that the alignment can be driven by alignment key elements on the tiles and the interconnection substrate. Referring to FIG. 7F, interconnection substrate 76 now includes alignment key 154 and contactor unit 78 now includes alignment lock 156. During the assembly process the alignment key and lock interact to improve the positional accuracy of mating the contactor unit to the interconnection substrate.

In one preferred embodiment, alignment key 154 is a pyramid of silicon on the surface of interconnection substrate 74. This can be formed, for example, by selectively etching the bulk of the interconnection substrate to leave a pyramidal structure remaining. Alternatively, this could be formed by depositing material on the interconnection substrate, as by depositing successively narrower layers of metal. Similarly, alignment lock 156 is a pyramidal pit formed in the "back" of contactor unit 78. Such a pit can be prepared by KOH etch as mentioned in regard to alignment substrate 150. Providing three or four lock/key pairs per contactor unit is generally sufficient to achieve the desired alignment. Since the lock, key, and any terminals for connecting contactor units to the interconnection substrate are all defined lithographically, this should allow for positional accuracy on the order of less than 0.1 micron between any of these elements.

The process of assembly is basically as described before. In this instance, during the reflow process, the alignment lock and key elements are brought into close proximity and interact to direct any aligning forces between the contactor unit and the interconnection substrate to within the limits of the lock and key. After cooling, each contactor unit is aligned to the interconnection substrate to within a high degree of accuracy, preferably within less than one micron. The other primary component of positional accuracy between probe elements on different contactor units then is the accuracy of probe elements within each contactor unit. Following an example given above, if the positional accuracy of resilient contact elements within each contactor is 3 microns, then the positional accuracy between probe elements on different contactors, i.e. across the large contactor, is less than 7 microns. Of course if the positional accuracy of the resilient contact elements is on the order of one micron, then the overall accuracy across the large contactor would be on the order of 3 microns or less.

Figure 7G:
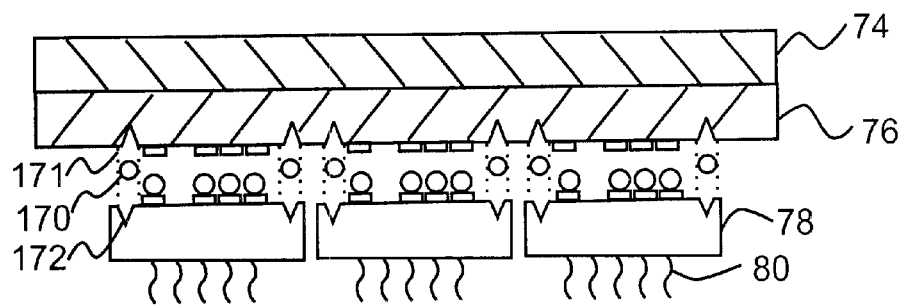
FIG. 7G illustrates a side elevational view, partially in section, of steps in another alternative method of fabricating the contactor of the present invention.

In another preferred embodiment, small spheres are used to align the contactor unit to the interconnection substrate. Referring to FIG. 7G, small sphere or ball 170 is placed in a groove or pit 171 in the interconnection substrate. A corresponding groove or pit 172 in contactor unit 78 is positioned to align with ball 170. The diameter of balls 170 is suitably 2±1 mils. In one preferred embodiment, the diameter of balls 170 is larger than the width of grooves or pits 171 and 172 to give some suitable standoff between contactor unit 78 and interconnection substrate 76.

Figure 7H:
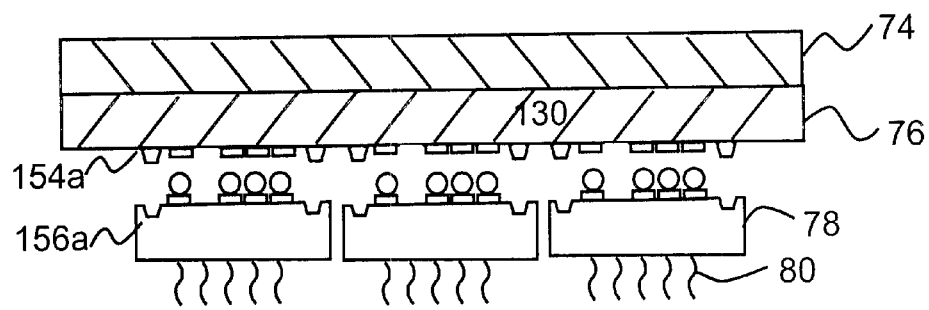
FIG. 7H illustrates a side elevational view, partially in section, of steps in another alternative method of fabricating the contactor of the present invention.

In another preferred embodiment, the alignment lock is a truncated pyramidal hole. Referring to FIG. 7H, alignment key 154*a* is a truncated pyramid and alignment lock 156*a* is a truncated pyramidal hole. Alternatively, alignment key 154*a* can be a rectangular prism. In either embodiment, alignment key 154*a* can be etched from a silicon body, leaving the desired key shape. Alternatively, alignment key 154*a* can be built up as one or more layers of metal or other suitable material, deposited in the desired shape, to fit the pyramidal hole, the alignment lock 156*a*. The alignment lock can be prepared by etching as described above. For example, a KOH etch for a limited time will etch a pyramidal hole.

Figure 8A:
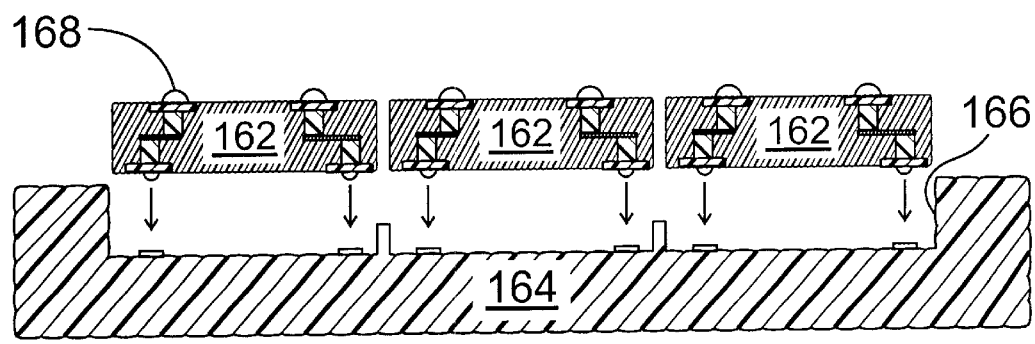
FIGS. 8A–8C are cross-sectional views of additional techniques for maintaining a plurality of contactor units in proper alignment with a larger substrate, according to the present invention.

Another useful alignment mechanism is illustrated in FIG. 8A. In this figure, wells are defined within the interconnection substrate, and the contactor units fit within these wells. The wells do not have to be continuous - a suitable region of vertical alignment component can be positioned to mate with the contactor unit. For example, vertical pins along three sides of a contactor unit would be helpful. This sort of alignment key also assists in establishing initial alignment of the contactor unit. This sort of alignment key can be used in conjunction with other alignment keys as well. For example, a "well" could define the approximate position, self-alignment could improve the position, and an alignment key could precisely refine the position of each contactor unit.

General Design Considerations

Figure 8B:
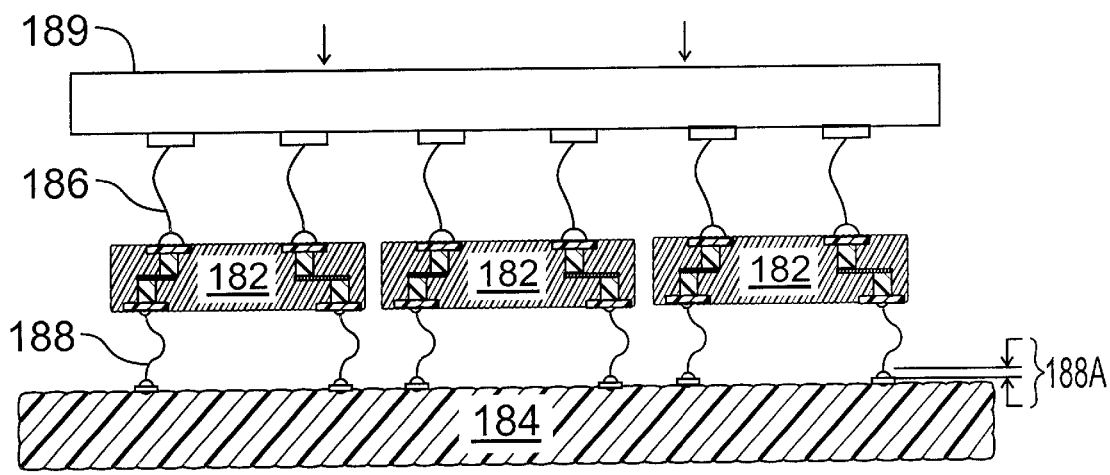
Figure 8C:
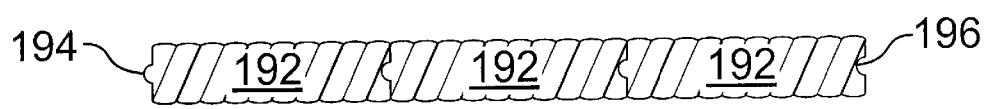

Referring now to FIGS. 8A–8C, a relatively large substrate, such as the interconnect substrate of a contactor, can be provided with a plurality of relatively small contactors having terminals on a surface thereof in order to facilitate the making of electrical connections to another electronic component having a relatively large surface area, such as a WUT, thereby permitting processes such as whole wafer exercising to be performed.

In the process of mounting a plurality of contactor units, each having a plurality of terminals, to a larger substrate, proper alignment must be maintained by:

(1) maintaining a prescribed height (typically coplanar) for the tips (distal, free ends) of the terminals in the Z-axis;

(2) maintaining a prescribed spacing between the tips of the terminals in the x and y axes; and (3) maintaining a prescribed alignment between tips of the terminals in the xy plane, as in a rotational component.

Generally, the process of fabricating a plurality of freestanding terminals on the contactor units is highly determinate in that the height (Z-axis) and the spacing (x and y axes) of the plurality of terminals on individual contactor units can be checked (inspected) prior to mounting the contactor units to a larger substrate. Contactor units having terminals with faulty height or spacing can either be reworked or discarded.

As discussed above, a plurality of contactor units can be mounted to larger substrates by reflow soldering. Large, carefully placed (e.g., lithographically) solder features (e.g., alignment marks) can substantially control the X-Y axes alignment of the contactor unit with respect to the substrate. By carefully controlling the amount of solder to be used, it is possible to exercise substantial control over the space between the opposing surfaces of the contactor unit and the larger substrate (Z-axis alignment). Any deviations in solder volume may cause unacceptable height (Z-axis) variations. Height uniformity being desired, any suitably precise means of controlling the solder volume may be employed, including using precisely-formed solder preforms, systems for delivering precise dollops of solder paste, solder balls of precise volume, and the like.

Turning now to FIG. 8A, an alternate mechanism for maintaining a plurality of contactor units 162 (three shown of many) in proper alignment with a larger substrate 164 is shown. In this case, the top surface of the larger substrate 164 is provided with a plurality of recesses or wells 166 (three shown of many) which are sized to receive the individual contactor units 162 and maintain them in a prescribed X-Y axes alignment with one another. Careful control of the solder volume can assure repeatable Z-axis (vertical in the figure) spacing between the bottom surfaces of the contactor units 162 and the top surface of the substrate 164. A glue or potting compound can also be injected between the bottom surface of the contactor units 162 and the top surface of the substrate 164 to secure the Z-axis alignment. The glue or potting compound may be a thermal or electrical insulator, may be rigid or elastomeric (providing support with some yield under pressure), or may have other desirable qualities as known by those skilled in the art. This alignment mechanism can be combined with the teachings of this invention to provide an alignment region, for example, at the upper surface of these tiles 162. As shown, the contactor units have capture pads 168 as probe elements.

Turning now to FIG. 8B, an alternate technique for maintaining a plurality of contactor units 182 (three shown of many) in proper alignment with a larger substrate 184 is shown. In this case, the top surface of each contactor unit 182 is provided with a plurality of freestanding spring contact elements 186 (two of many shown) which are fabricated in a manner (e.g., materials, spring shape) such that they will operate principally in an elastic mode rather than a plastic mode. The bottom surface of each contactor units 182 is provided with a plurality of contact elements 188 (two of many shown) which are fabricated in a manner such that they will operate substantially in a plastic deformation mode. These contact elements 188 are termed "compliant connections". The contactor units 182 are soldered, via the contact elements 188, to the substrate in any suitable manner, and a solder reflow process ensures that contactor units 182 are in X-Y alignment with one another. In order to establish coplanarity of the tips (top ends, as viewed) of the free standing spring contact elements 186, a pressure plate 189 is urged downward against the tips of the spring contact elements 186 until contact is made with all of the spring contact elements 186. The plastic deformation of the contact elements 188 will allow individual contactor units 182 to move downward in the Z-axis. After ensuring that the tips of all the spring contact elements 186 are coplanar, the contactor units 182 can be secured in place with a potting compound (not shown), such as epoxy, and the pressure plate 189 can be removed. The potting compound should at least "underfill" the space between the contactor units 182 and the large substrate 184, and may also cover the contactor units so long as some portion of the probe elements are exposed and function with the desired degree of resilience.

Note that the contact elements 188 need not be weak springs. Contact elements 188 can be (a) "rooted," that is built on and up from, either the substrate or the tile, with an adjustment region 188A between the tip of that spring and the other element of the substrate/tile pair and (b) can be of a resiliency that is in the elastic deformation region, not plastic, to create a useful connection without introducing a potting or other securing compound. Another useful adjunct to this figure is that the contactor units can be aligned using the alignment fixtures of this invention to provide not only Z alignment, but also X and Y alignment, as taught throughout this description. For example, pressure plate 189 can include alignment elements as in alignment substrate 150 (FIG. 7A).

Turning now to 8C, an alternate technique for maintaining a plurality of contactor units 192 (three shown of many) in proper Z-axis alignment with one another is shown. For clarity, the larger substrates (e.g., 174, 184) are omitted from the figure. In this case, the side edges of the contactor units 192 are provided with interlocking "tongue and groove" features, such as convex features 194 that mate with convex features 196.

A variety of probe elements are useful with this invention. Most of examples have included contact elements with resilient contact elements for mating to terminals on a typical semiconductor. Another very useful contact element is a simple pad or pit for mating with a resilient contact element on a semiconductor. FIGS. 8A and 8C illustrate such a contact element. A particularly preferred contact pit is a pyramidal pit, plated to be conductive, and connected as needed to other circuitry.

Figure 8D:
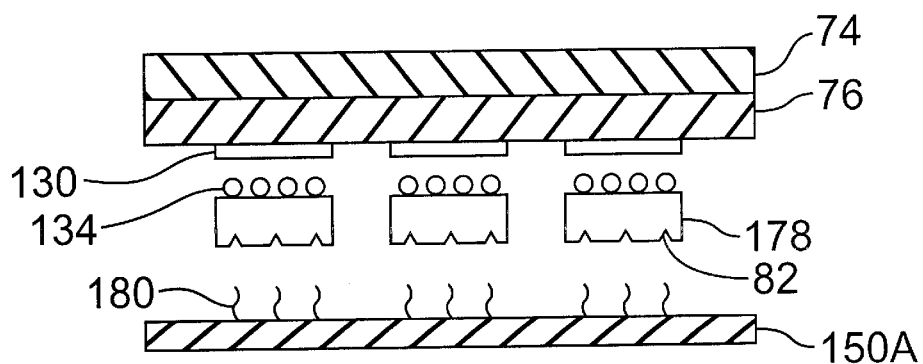
FIG. 8D illustrates a side elevational view, partially in section, illustrating another alternative embodiments of the contactor of the present invention.

For example, referring to FIG. 8D and comparing the assembly illustrated in FIGS. 7A and 7B, a preferred contactor unit 178 includes a plurality of contact elements in the form of conductive pits 82. This contactor unit can be mounted to interconnection substrate 76 essentially as described above using self-alignment alone. Alternatively, alignment substrate 150A includes an array of resilient contact structures 180. Alignment substrate 150A matches a corresponding product wafer, and in fact a product wafer can be used for this step. Resilient contact structures 180 are brought into contact with conductive pits 82 and the assembly including interconnection substrate 76 is reflowed. As described above in connection with FIGS. 7A and 7B, alignment substrate 150A refines the alignment of contactor units 178 to precisely position various contactor units relative to the interconnection substrate 76.

In a similar manner, contactor units similar to 178 can be made to include an alignment lock 156 (FIG. 7F) and aligned as described in connection with FIG. 7F.

DISCUSSION

A comparison will now be made of some of the various techniques disclosed above. In the important and preferred alignment mechanism of FIG. 7F, the alignment projections such as alignment key 154 are on either the interconnection substrate or the contactor unit, with corresponding alignment recesses such as alignment lock 156 on the opposing surface. The correct amount of joining material is used so the Z displacement between the contactor unit and the interconnection substrate allows the projections to fit within the recesses to provide for alignment. Here the alignment mechanism is closely tied to the adjustment region to more precisely refine the adjustment.

Alignment as shown in FIG. 7A is quite different. In that instance, an adjustment region is remote from the alignment element. When the joining material is malleable, forces passed through the springs 80 (in the embodiment shown) are balanced against any aligning forces inherent in the adjustment region, such as surface tension, to give a position which is locked in by fixing the joining material. In a typical application of this method, a very precise, large jig includes alignment elements for multiple, preferably all, tiles. If all aligned tiles are adjusted simultaneously, there should be a very high precision correspondence from ultimate contact elements (spring tips here) between any of the tiles so that the whole is highly precise. By contrast, without the alignment jig, the alignment of the contact elements will depend on the precision of positioning each tile independently.

Comparing the embodiments of FIGS. 5E and 7A, the embodiment of FIG. 5E has two alignment regions, and the alignment mechanism is predominantly surface tension. Depending on the materials for joining tip structures to spring tips and tile to a substrate, the materials may be malleable at the same time, in which the tile/spring unit floats between the aligning forces at the tip structures and at the substrate. The materials may be malleable under different conditions, such that at one temperature the tile/spring unit floats but at a lower temperature, one of the alignment regions is fixed, allowing the other to adjust to some energy minimum.

As is illustrated by the above described embodiments, a key to the invention is the alignment of first contact elements between respective contactor units. One useful adjustment region is a plane between the "back" of a contactor unit and the support substrate. These can be aligned using a malleable connecting material such that the contactor can be brought into a low-energy configuration through:

(1) surface tension of the connecting material (especially if the joining material is in a fluid state with low viscosity and good wetting properties, e.g., liquid solder);

(2) an alignment key (matching pits and pins, e.g., pyramid; wells defined in or walls on the support substrate, a jig for aligning the first contact elements); or (3) a positioner (some sort of external manipulator or fixture which positions the contactor and support substrate).

Movement in the adjustment region can include X and Y as well as rotational components, and some degree of Z movement. For example, there may be a leveling effect, and the components may need to be held horizontal for a typical fabrication. The parts could be tipped to promote some other angled relationships.

A second adjustment region can be present where, for example, tip elements are joined to the free ends of an array of contacts. As before, a second malleable joining material can be used in much the same way as the first joining material.

Different joining materials are malleable under different conditions. In general, soldering and brazing materials reflow at elevated temperatures. Conductive epoxies, however, are generally malleable at room temperature and cure at elevated temperatures.

The first and second joining materials can be in a malleable state under the same or different conditions. For example, solders having different compositions and melting points can be used to liquefy at different times to effect the position optimization of the various elements separately or can liquefy at the same time to get optimization between multiple adjustment regions. For example, the tip elements may be attached with a high melting point solder, while the tiles are attached with a lower melting point solder. The tip elements may be coupled to the contact elements at a high temperature, in a fixture that precisely positions the tip elements and the tile. The tile (with attached tip elements) then can be coupled to a support substrate (fixtured, using alignment keys, etc.) and heated above the lower temperature but below the higher temperature to position and secure the tile to the substrate. Optionally, the entire unit can be driven above the higher temperature to reflow everything, allowing for adjustment (by natural forces, e.g., surface tension, or by alignment aids) of the position of the tile relative to each of the tip elements and the support substrate.

This last situation is particularly interesting. In general, the tip structures and the support substrate are positioned with some desired degree of high accuracy, then the connecting contact elements and a contactor unit are allowed to reach a stable position that preserves the desired relationship between tip elements and support substrate.

There can be more adjustment regions. Instead of building only two separate elements and combining them by soldering or brazing, it is also possible to build multi-part structures with two or more connecting steps. Copending, common-assigned patent application U.S. Ser. No. 09/023, 859, filed Feb. 13, 1998(status: pending), details a variety of such structures and how to make them. Extending this, securing a contactor to a support substrate becomes an additional connecting step. Thus, one could provide an adjustment region between any pair of the following "layers" of the finished product: support substrate, carrier, base, <optional spacer>, main body, <optional spacer>, tip structure. One skilled in the art can select materials and conditions to provide a desired degree of malleability in each of these connections, potentially allowing quite flexible aligning conditions.

For the alignment key, positional accuracy is very high; on the order of a micron and even much less, measured from feature to feature on a single silicon substrate. Using a lithographic substrate, contactor units can be aligned to a comparable accuracy. The nominal distances between selected features on separate contactor units are accurate to less than 25 microns, preferably less than 1 micron. Thus a number of contactor units can be aligned on a substrate such as an 8" wafer with an accuracy of better than 1 mil (25 microns), and preferably 0.1 mil or better.

The positional accuracy of surface tension alignment will not be this high. Contact on each "side," e.g., a series of pads on the substrate, can be defined to this high degree of accuracy but the connection between them will depend on the characteristics of the coupling material, including any connecting structures such as springs. Nevertheless, a spring with a circular cross section of 1 mil (25 microns) will align on a target pad of 3×3 mil (75 microns) to within about a mil. If an array of spring tips are dimensionally accurate to within 1 mil overall (taken between any tip and the position of its reference location, i.e., the target pad) this will result in an overall accuracy on the order of 1 mil. This will hold true over a large substrate as well.

Positioners are limited in accuracy depending on the interrelationship of all of the various components, but in general can be on the order of a fraction of a mil.

The contactor unit typically has first and second contact elements. The first contact element connects to a separate electrical component (typically a semiconductor, typically the device under test), and a second contact element connects to a second electrical component (typically a test circuit). In one of the preferred embodiments, the first contact element is a spring such as the composite spring that is described in FIG. 4A. This element equally well can be a solder ball, as in a C4 ball, as well as a pit or hole (FIGS. 4C, 4D).

A general description of the apparatus and method of the present invention, as well as preferred embodiments of both, have been set forth above. One skilled in the art will recognize and be able to practice many changes in many aspects of the apparatus and method described above, including variations which fall within the teachings of this invention. The spirit and scope of the invention should be limited only as set forth in the claims that follow. For example, it is considered within the scope of the invention to provide resilient spring contact elements on the DUTs and to provide corresponding pads or indentations on the contactor units of the contactor. Additionally, although the contactor units have been illustrated as discrete devices mounted to an interconnect substrate, it is considered within the scope of the present invention to utilize a contactor unit substrate containing a plurality of integral contactor units.

What is claimed is:

1. A segmented contactor comprising:
    an interconnect substrate having a plurality of contact areas formed on a surface thereof;
    a plurality of contactor units, each comprising a first side and a second side;
    a plurality of conductive, elongate connection elements, each having a first end and a second end, each attached at said first end to said first side of one of said plurality of contact units;
    a sacrificial substrate;
    a plurality of tips formed on said sacrificial substrate;
    first joining material disposed between each of said plurality of contactor units and each of said plurality of contact areas, said first joining material having a surface tension while in a liquid state, whereby each of said plurality of contactor units is substantially aligned with a corresponding one of said plurality of contact areas; and
    second joining material disposed between each of said plurality of tips and said second ends of each of said connection elements, said second joining material having a surface tension while in a liquid state, whereby each of said plurality of tips is substantially aligned with said second end of a corresponding one of said plurality of interconnection elements.

2. The segmented contactor of claim 1, wherein said interconnect substrate comprises a probe card configured to make a plurality of electrical connections with semiconductor testing equipment.

3. The segmented contactor of claim 2, wherein said plurality of tips are positioned to make contact with a plurality of test points on a semiconductor device.

4. The segmented contactor of claim 1, wherein said plurality of tips are formed lithographically.

5. The segmented contactor of claim 4, wherein each of said plurality of tips comprises a pyramidal structure.

6. The segmented contactor of claim 1 further comprising a mechanical mechanism for aligning said plurality of contactor units with said plurality of contact areas.

7. The segmented contactor of claim 6, wherein said mechanical mechanism comprises a protruding key and a recessed lock.

8. The segmented contactor of claim 1, wherein said connection elements are resilient.

* * * * *